(12) United States Patent
Tran et al.

(10) Patent No.: US 12,022,745 B2
(45) Date of Patent: Jun. 25, 2024

(54) PROGRESSIVE THERMAL DRYING CHAMBER FOR QUANTUM CIRCUITS

(71) Applicant: Microsoft Technology Licensing, LLC, Redmond, WA (US)

(72) Inventors: Quang Thanh Tran, San Jose, CA (US); Judith Cutaran Aarts, San Jose, CA (US); John S. Hickman, Reno, NV (US); Thanh Cong Dinh, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 529 days.

(21) Appl. No.: 17/321,462

(22) Filed: May 16, 2021

(65) Prior Publication Data

US 2022/0367781 A1    Nov. 17, 2022

(51) Int. Cl.
| | |
|---|---|
| *H10N 60/01* | (2023.01) |
| *G06N 10/00* | (2022.01) |
| *H01L 21/67* | (2006.01) |
| *H10N 69/00* | (2023.01) |

(52) U.S. Cl.
CPC ............ *H10N 60/01* (2023.02); *G06N 10/00* (2019.01); *H01L 21/67034* (2013.01); *H10N 69/00* (2023.02)

(58) Field of Classification Search
CPC .. H10N 60/01; H10N 69/00; H01L 21/67034; G06N 10/00
USPC .......................................................... 34/552
See application file for complete search history.

(56) References Cited

U.S. PATENT DOCUMENTS

| | | | |
|---|---|---|---|
| 4,787,752 A | 11/1988 | Fraser et al. | |
| 5,048,201 A * | 9/1991 | Layton | F26B 21/003 |
| | | | 219/400 |
| 5,582,235 A | 12/1996 | Hamilton et al. | |
| 6,067,727 A * | 5/2000 | Muraoka | H01L 21/68728 |
| | | | 34/76 |

(Continued)

FOREIGN PATENT DOCUMENTS

| | | | | |
|---|---|---|---|---|
| CN | 117321428 A | * | 12/2023 | ............. G06N 10/00 |
| WO | WO-9604410 A1 | * | 2/1996 | ............. C23C 14/14 |
| WO | WO-2022245468 A1 | * | 11/2022 | ............. G06N 10/00 |

OTHER PUBLICATIONS

"International Search Report and Written Opinion Issued in PCT Application No. PCT/US22/026084", dated Jul. 29, 2022, 10 Pages.

*Primary Examiner* — Stephen M Gravini
(74) *Attorney, Agent, or Firm* — Wade IP Law PLLC

(57) ABSTRACT

Techniques are described herein that are capable of progressively thermally drying a quantum circuit. An inert gas is progressively heated by a heater element to provide a heated inert gas. Heated ambient air and the heated inert gas combine in a heating channel, causing a combination of the heated ambient air and the heated inert gas to flow into a probe compartment to progressively thermally dry a quantum circuit therein. A flow rate of the inert gas is controlled to cause the combination to have a relative humidity less than or equal to a threshold. A temperature of the heater element may be controlled to be approximately equal to a progressively increasing target temperature within a tolerance of 3.0° C. Heating of the inert gas may be initiated based on detection of the inert gas, and the flow and heating of the inert gas may be automatically discontinued.

20 Claims, 7 Drawing Sheets

Iso View

(56) References Cited

U.S. PATENT DOCUMENTS

| | | | |
|---|---|---|---|
| 6,248,399 B1 * | 6/2001 | Hehmann | C23C 14/22 137/561 A |
| 11,693,322 B2 * | 7/2023 | Miura | G03F 7/422 134/18 |
| 11,769,663 B2 * | 9/2023 | Otsuji | H01L 21/67034 134/4 |
| 2006/0037412 A1 | 2/2006 | Brunner | |
| 2007/0023536 A1 | 2/2007 | Baston | |
| 2013/0206383 A1 | 8/2013 | Maeda et al. | |
| 2022/0367781 A1 * | 11/2022 | Tran | H10N 69/00 |

* cited by examiner

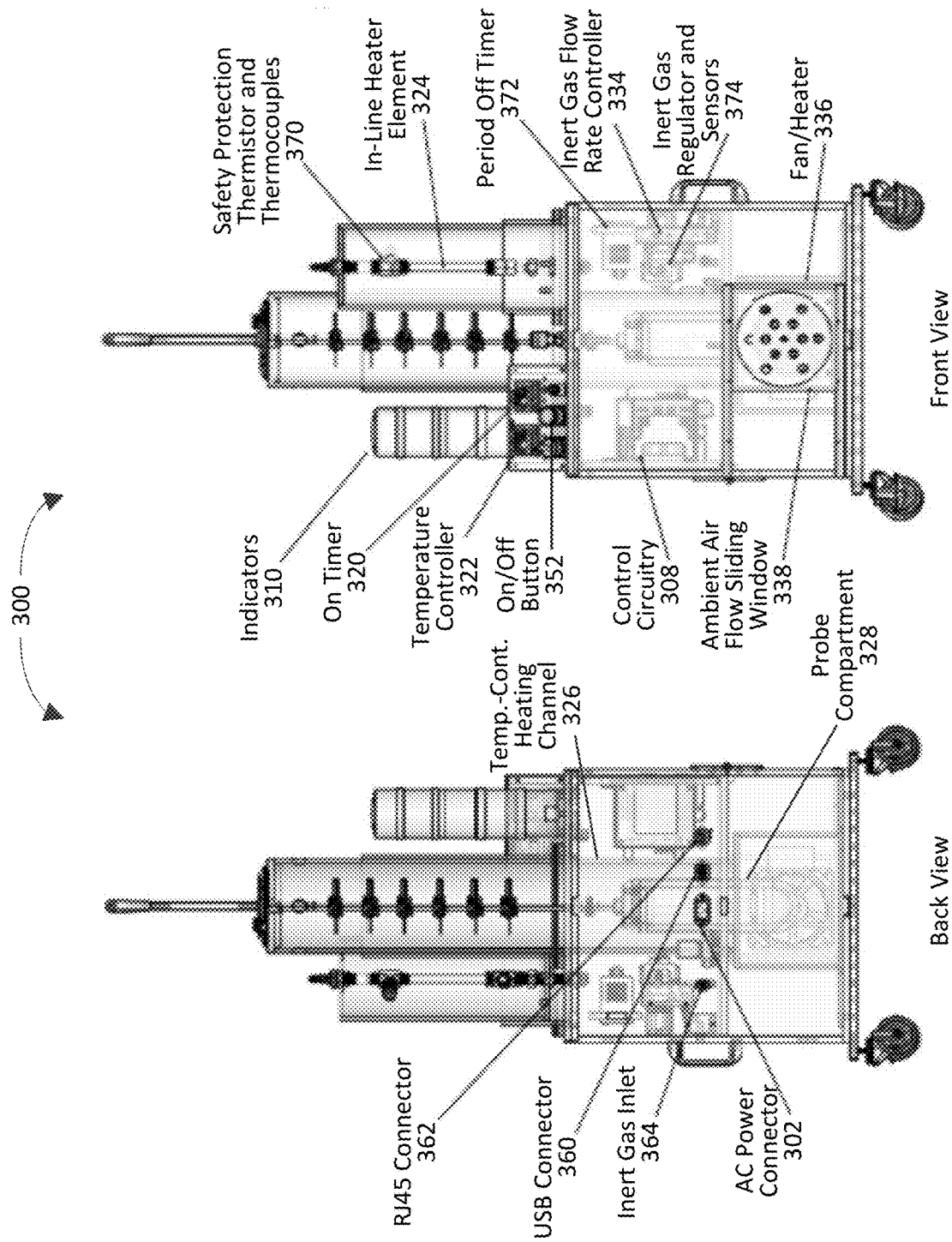

PROGRESSIVE THERMAL DRYING CHAMBER FOR QUANTUM CIRCUITS

BACKGROUND

Quantum circuits often are tested at temperatures near absolute zero (~−273° C.). For instance, a quantum circuit may be placed in a probe (e.g., cryogenic quantum testbed, hermetic test probe, or cryogenic probe card), and the probe may be immersed in a liquified inert gas (e.g., liquid nitrogen or liquid helium) for purposes of testing. Immersion of the probe in the liquified inert gas causes a temperature of the quantum circuit to remain near absolute zero during testing.

After testing, the probe, including the quantum circuit, is removed from the liquified inert gas. If the quantum circuit is exposed to ambient air after removal from the liquified inert gas, water condensation and icing on the quantum circuit may occur, which may cause the temperature of the quantum circuit to change quickly. An abrupt temperature change, such as from near absolute zero to room temperature (~+25° C.), is likely to cause substantial structural damage to the quantum circuit. For example, the abrupt temperature change may cause traces on the quantum device to shrink, break, or crack, and the reliability of the connections on the quantum device may be negatively affected. In an effort to avoid such structural damage, the probe, including the quantum circuit, typically is placed in a thermal drying chamber to provide control over the temperature of the quantum circuit.

However, conventional thermal drying chambers may be relatively inefficient, inaccurate, and/or burdensome to operate. For instance, heat that is intended to warm up the quantum circuit and inert gas that is intended to keep the quantum circuit dry may escape to other parts of a thermal drying chamber and therefore not have the intended effect on the quantum circuit. The inert gas in conventional thermal drying chambers may be heated to a temperature that is believed to be sufficient to thermally dry the quantum circuit without regard to precision. Conventional thermal drying chambers often require oversight by a human throughout the thermal drying process. Safety features usually are not designed into conventional thermal drying chambers.

SUMMARY

Various approaches are described herein for, among other things, progressively thermally drying a quantum circuit. Progressively thermally drying a quantum circuit involves increasing thermal energy that is applied to the quantum circuit until the quantum circuit reaches a temperature at which water does not condense (e.g., ice does not form) on an outer surface of the quantum circuit.

In an example approach, a progressive thermal drying chamber includes a probe compartment, a temperature-controlled heating channel, an in-line heater element, a temperature controller, a flow rate controller, and electronic control circuitry. The probe compartment is configured to house a quantum circuit during a thermal drying process. The temperature-controlled heating channel is coupled to the probe compartment and is configured to provide a heated combination to the probe compartment. The heated combination includes heated ambient air and a heated inert gas. The in-line heater element is configured to heat an inert gas to provide the heated inert gas. The temperature controller is configured to control a temperature of the in-line heater element such that the in-line heater element progressively heats the inert gas as the inert gas flows into the temperature-controlled heating channel. The flow rate controller is configured to control a rate at which the inert gas flows into the temperature-controlled heating channel to cause the heated combination to have a relative humidity less than or equal to a relative humidity threshold. The electronic control circuitry is configured to control the in-line heater element and the temperature controller. The electronic control circuitry is external to the temperature-controlled heating channel.

In an example approach of progressively thermally drying a quantum circuit, an inert gas is progressively heated by an in-line heater element as the inert gas flows into a temperature-controlled heating channel toward a probe compartment that includes the quantum circuit to provide a heated inert gas. The progressively heating includes controlling a temperature of the in-line heater element to be approximately equal to a target temperature, which progressively increases over time, within a tolerance of 3.0° C. Heated ambient air and the heated inert gas are caused to be combined in the temperature-controlled heating channel, which causes a heated combination, including the heated ambient air and the heated inert gas, to flow into the probe compartment to progressively thermally dry the quantum circuit. A rate at which the inert gas flows into the temperature-controlled heating channel is controlled to cause the heated combination to have a relative humidity less than or equal to a relative humidity threshold.

In another example approach of progressively thermally drying a quantum circuit, initiation of a thermal drying process is identified based on (e.g., based at least in part on) detection of an inert gas flowing toward a probe compartment that includes the quantum circuit. Heating of the inert gas is automatically initiated by an in-line heater element as the inert gas flows into the temperature-controlled heating channel to provide a heated inert gas based on the initiation of the thermal drying process. Heated ambient air and the heated inert gas are caused to be combined in the temperature-controlled heating channel, which causes a heated combination, including the heated ambient air and the heated inert gas, to flow into the probe compartment to progressively thermally dry the quantum circuit. A rate at which the inert gas flows into the temperature-controlled heating channel is controlled to cause the heated combination to have a relative humidity less than or equal to a relative humidity threshold. Flow of the inert gas into the temperature-controlled heating channel and the heating of the inert gas are automatically discontinued based on a discontinuation of the thermal drying process.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

FIGS. 3A-3B depict a back view and a front view of an example progressive thermal drying chamber in accordance with an embodiment.

Figure 1:
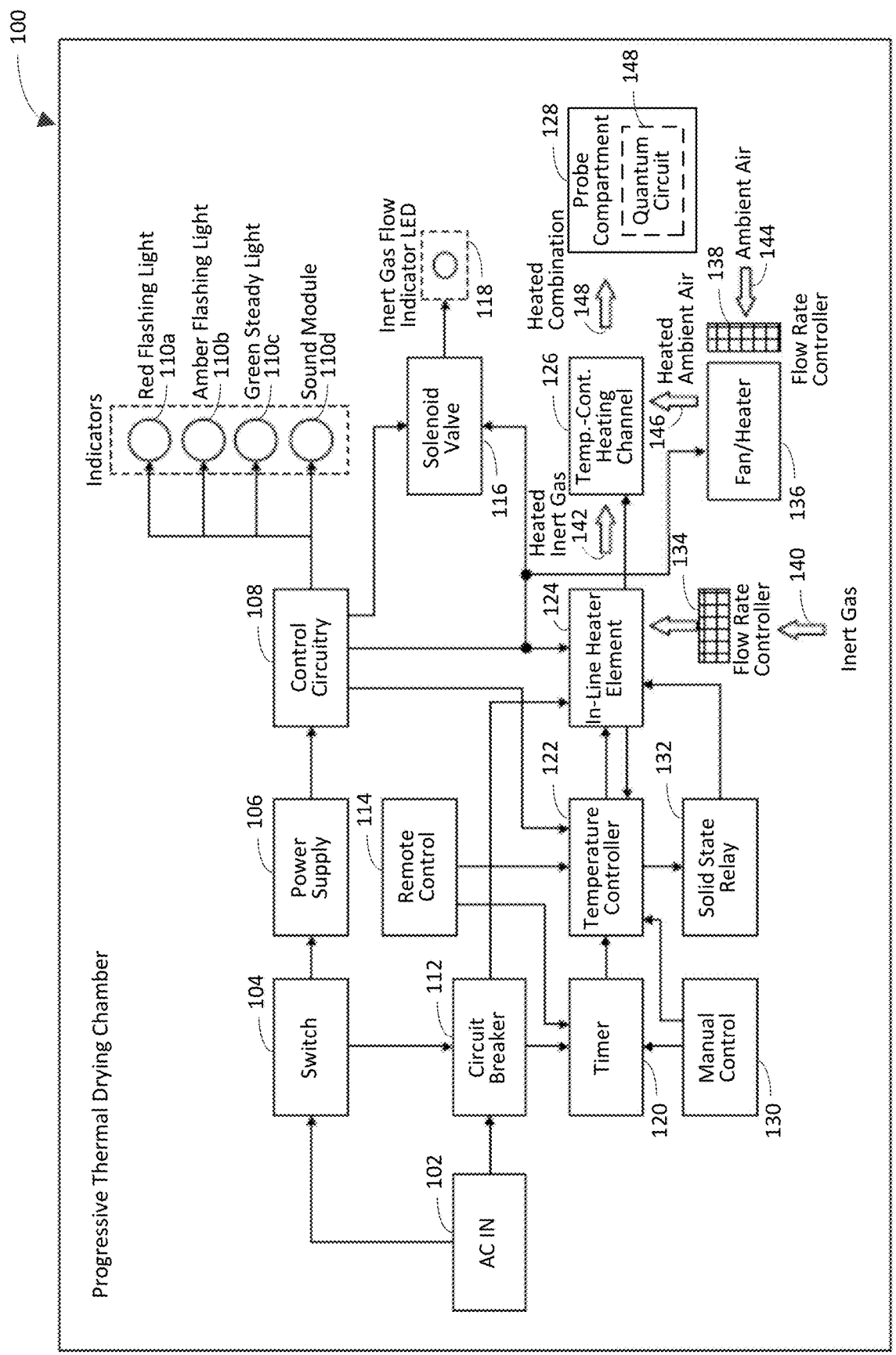
FIG. 1 is a block diagram of an example progressive thermal drying chamber in accordance with an embodiment.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

Descriptors such as "first", "second", "third", etc. are used to reference some elements discussed herein. Such descriptors are used to facilitate the discussion of the example embodiments and do not indicate a required order of the referenced elements, unless an affirmative statement is made herein that such an order is required.

II. Example Embodiments

Example embodiments described herein are capable of progressively thermally drying a quantum circuit. Progressively thermally drying a quantum circuit involves increasing thermal energy that is applied to the quantum circuit until the quantum circuit reaches a temperature at which water does not condense (e.g., ice does not form) on an outer surface of the quantum circuit.

Example techniques described herein have a variety of benefits as compared to conventional techniques for thermally drying a quantum circuit. For instance, the example techniques may be capable of increasing efficiency of a thermal drying process and a progressive thermal drying chamber that performs the thermal drying process. For example, an in-line heater element in the progressive thermal drying chamber may apply thermal energy to an inert gas as the inert gas flows into a temperature-controlled heating channel to increase an efficiency with which the thermal energy is applied to the inert gas. The temperature-controlled heating channel may be coupled to a probe compartment that houses the quantum circuit to increase an efficiency with which the heated inert gas is provided to the probe compartment. For instance, by coupling the temperature-controlled heating channel to the probe compartment, all of the heated inert gas may flow into the probe compartment to thermally dry the quantum circuit.

The example techniques may conserve inert gas by automatically stopping flow of the inert gas when the thermal drying process ends or is interrupted. The example techniques may automatically stop heating of the inert gas when the thermal drying process ends or is interrupted, when a flow of the inert gas is interrupted, when an amount of available inert gas is less than a threshold amount, and when a temperature of a heating element that is used to heat the inert gas reaches a threshold temperature. Accordingly, the example techniques may thermally dry a quantum circuit more safely than conventional techniques.

The example techniques may automate the thermal drying process. Accordingly, an amount of time that is consumed to thermally dry a quantum circuit may be reduced. A user experience of a person who oversees the thermal drying process may be increased, for example, by obviating a need for the person to perform operations manually. By eliminating a need for the person to perform operations manually, a cost of thermally drying a quantum circuit may be reduced. For instance, time spent by a person to perform manual operations has an associated cost. By eliminating the manual operations, the cost of thermally drying the quantum circuit can be reduced by the labor cost associated with the person performing the manual operations.

The example techniques may control a temperature of an in-line heater element (and therefore a temperature of the heated inert gas) more accurately and/or precisely than conventional techniques. By controlling the temperature more accurately and/or precisely, the example techniques may reduce a likelihood that the quantum circuit is structurally damaged during the thermal drying process. Control circuitry (e.g., electronics and motors) of the progressive thermal drying chamber may be thermally isolated from the heated inert gas and the ambient heated air that flows into the temperature-controlled heating chamber to increase reliability of the control circuitry.

FIG. 1 is a block diagram of an example progressive thermal drying chamber 100 in accordance with an embodiment. Generally speaking, the progressive thermal drying chamber 100 operates to progressively thermally dry a quantum circuit 148. For instance, the progressive thermal drying chamber 100 may gradually increase a temperature of the quantum circuit 148 from near absolute zero to room temperature while attempting to prevent water from condensing on an outer surface of the quantum circuit 148. As shown in FIG. 1, the progressive thermal drying chamber 100 includes an alternating current (AC) power input terminal 102 (labeled "AC IN"), a switch 104, a power supply 106, control circuitry 108, indicators 110a-110d, a circuit breaker 112, a remote control 114, a solenoid valve 116, an inert gas flow indicator light emitting diode (LED) 118, a timer 120, a temperature controller 122, an in-line heater element 124, a temperature-controlled heating channel 126, a probe compartment 128, a manual control 130, a solid state relay 132, flow rate controllers 134 and 138, and a fan/heater 136.

The AC IN 102 receives AC power from an AC power source and provides the AC power to the switch 104 and the circuit breaker 112. The switch 104 is controllable to toggle the progressive thermal drying chamber 100 between an ON state and an OFF state. In the ON state, the switch 104 forwards the AC power to the power supply 106 and the circuit breaker 112, which enables the progressive thermal drying chamber 100 to perform the thermal drying process to thermally dry the quantum circuit 148 housed by the probe compartment 128. In the OFF state, the switch 104 does not forward the AC power to the power supply 106 and the circuit breaker 112, and the progressive thermal drying chamber 100 is therefore incapable of performing the thermal drying process. The power supply 106 convers the AC power to direct current (DC) power and provides the DC power to the control circuitry 108.

The control circuitry 108 controls the indicators 110a-110d, the solenoid valve 116, the temperature controller 122, the in-line heater element 124, and the fan/heater 136. The control circuitry 108 may also control one or both of the flow rate controllers 134 and 138. The control circuitry 108 may detect events and conditions associated with the thermal drying process and generate control signals for controlling the indicators 110a-110d, the solenoid valve 116, the temperature controller 122, the in-line heater element 124, the fan/heater 136, the flow rate controller 134, and the flow rate controller 138 based on those events and conditions.

For instance, the control circuitry 108 may turn on a red flashing light 110a based on detection of a safety issue. Examples of a safety issue include but are not limited to a flow of inert gas 140 being interrupted (e.g., the inert gas 140 is not connected to the flow rate controller 134 or an amount of the inert gas 140 is less than a threshold amount), a temperature of the in-line heater element 124 being greater than or equal to a temperature threshold, and an erroneous temperature setup (e.g., manually, through a graphical user interface (GUI), in software, or by malfunction). The control circuitry 108 may turn on an amber flashing light 110b based on the thermal drying process being complete. The control circuitry may turn off the amber flashing light 110b after a designated amount of time has elapsed since the amber flashing light 110b was turned on. The control circuitry 108 may turn on a green steady light 110c based on the thermal drying process being in progress (i.e., currently being performed). The control circuitry 108 may turn on a sound module 110d to generate sound (e.g., an alarm) in conjunction with the operation of any of the other indicators 110a-110c.

The control circuitry 108 controls the temperature controller 122 to set the temperature of the in-line heater element 124 to correspond to target temperatures at respective time instances throughout the thermal drying process. For instance, the control circuitry 108 may provide a first control signal at a first time instance to cause the temperature of the in-line heater element 124 to be a first temperature; the control circuitry 108 may provide a second control signal at a second time instance to cause the temperature of the in-line heater element 124 to be a second temperature, and so on. In this manner, the control circuitry 108 may cause the temperature of the in-line heater element 124 to gradually increase from near absolute zero to room temperature over the course of the thermal drying process. The control circuitry 108 may detect that the temperature of the in-line heater element 124 has reached a threshold temperature and control the temperature controller 122 to stop applying thermal energy to the in-line heater element 124 based on the in-line heater element 124 reaching the threshold temperature.

The control circuitry 108 controls the in-line heater element 124 to enable the in-line heater element 124 to heat the inert gas 140 and to provide the resulting heated inert gas 142 to the temperature-controlled heating channel 126. Examples of an inert gas include but are not limited to nitrogen and helium. The inert gas 140 may be in gaseous form or liquid form. The control circuitry 108 controls the solenoid valve 116 to change the flow of the heated inert gas 142. The control circuitry 108 controls the fan/heater 136 to set an amount of thermal energy that is applied to ambient air 144 that passes through the fan/heater 136, resulting in heated ambient air 146. The control circuitry 108 may set a rate with which the fan in the fan/heater 136 blows the heated ambient air 146 into the temperature-controlled heating channel 126.

The control circuitry 108 may generate an inert gas control signal that indicates a rate at which the inert gas 140 is to flow into the temperature-controlled heating channel 126. By sending the inert gas control signal to the flow rate controller 134, the control circuitry 108 may cause the flow rate controller 134 to set a rate with which the inert gas flows into the temperature-controlled heating channel 126 to the rate indicated by the inert gas control signal. The control circuitry 108 may generate an ambient air control signal that indicates a rate at which the ambient air 144 is to flow through the fan/heater 136. By sending the ambient air control signal to the flow rate controller 138, the control circuitry 108 may cause the flow rate controller 138 to set a rate with which the ambient air flows through the fan/heater 136 to the rate indicated by the ambient air control signal. The control circuitry 108 may include any of a variety of components, including but not limited to wiring and motors.

The circuit breaker 112 is configured to stop the thermal drying process based on the AC power experiencing a surge that exceeds a power threshold. For instance, the circuit breaker 112 may stop the timer 120 from incrementing a clock that tracks progress of the thermal drying process based on the AC power exceeding the power threshold. The circuit breaker 112 may stop the in-line heater element 124 from heating the inert gas 140 based on the AC power exceeding the power threshold.

The remote control 114 enables a user of the progressive thermal drying chamber 100 who is located remotely from the progressive thermal drying chamber 100 to set variables associated with the thermal drying process. Examples of such variables include but are not limited to a temperature to which the in-line heater element 124 is to be heated; a maximum temperature, which corresponds to the in-line heater element 124, at which the in-line heater element 124 is to stop heating the inert gas 140; a relative humidity threshold associated with the thermal drying process; a duration of the thermal drying process; a rate at which the inert gas 140 is to flow into the temperature-controlled heating channel 126; and a rate at which the ambient air 144 is to flow through the fan/heater 136 or into the temperature-controlled heating channel 126. Communication between the remote control 114 other components of the progressive thermal drying chamber 100, such as the timer 120 and the temperature controller 122, is carried out using one or more well-known wireless communication protocols, such as Bluetooth® or ZigBee®. For instance, such communication may be carried out over a network, such as a personal area network (PAN), a wide-area network (e.g., the Internet), a local area network (LAN), another type of network, or a combination thereof.

The solenoid valve 116 is capable of changing the flow of the heated inert gas 142. For instance, the solenoid valve 116 may direct a portion of the inert gas 140 to a detector associated with the inert gas flow indicator LED 118 so that the detector can detect whether the inert gas 140 is flowing. The detector may be configured to cause the inert gas flow indicator LED 118 to turn on based on detection that the inert gas 140 is flowing. The detector may be configured to cause the inert gas flow indicator LED 118 to turn off based on detection that the inert gas 140 is not flowing. The inert gas flow indicator LED 118 is configured to turn on when the inert gas 140 is flowing and is further configured to turn off when the inert gas 140 is not flowing, as indicated by a signal received from the aforementioned detector.

The timer 120 tracks an elapsed time for which the thermal drying process occurs. For instance, the timer 120 may start a clock at a time instance at which the thermal drying process starts. The timer 120 may provide a notification to the temperature controller 122, indicating that the thermal drying process has started. For instance, the notification may trigger the temperature controller 122 to set a temperature of the in-line heater element 124. The time 120 may stop the clock at a time instance at which the thermal drying process ends. The timer 120 may provide a notification to the temperature controller 122, indicating that the thermal drying process has ended. For instance, the notification may trigger the temperature controller 122 to discontinue setting the temperature of the in-line heater element 124.

The temperature controller 122 controls the temperature of the in-line heater element 124 to cause the in-line heater element 124 to progressively heat the inert gas 140 as the inert gas 140 flows into the temperature-controlled heating channel 126. For instance, the temperature controller 122 may generate a first control signal at a first time instance to set the temperature of the in-line heater element 124 to be a first temperature; the temperature controller 122 may generate a second control signal at a second time instance to set the temperature of the in-line heater element 124 to be a second temperature, and so on. In a current magnitude example, the first control signal may include a current having a first magnitude; the second control signal may include a current having a second magnitude, and so on. The temperature controller 122 may generate the control signals based on corresponding control signals that are received from the control circuitry 108. For example, the control signals from the control circuitry 108 may indicates the currents that are to be included in the control signals that are generated by the temperature controller 122. In accordance with this example, the temperature controller 122 may generate its control signals to include the currents that are specified by the corresponding control signals from the control circuitry 108.

In an example embodiment, the temperature controller 122 is configured to control the temperature of the in-line heater element 124 to track a progressively increasing target temperature within a targeted tolerance. For instance, the temperature controller 122 may cause the in-line heater element 124 to track the progressively increasing target temperature within a tolerance of 3.0° C., 2.5° C., 2.0° C., 1.5° C., 1.0° C., 0.5° C., 0.2° C., or 0.1° C. The temperature controller 122 may be configured to monitor the temperature of the in-line heater element 124 and to toggle the in-line heater element 124 between an ON state and an OFF state to maintain the temperature of the in-line heater element 124 within the targeted tolerance. In the ON state, the in-line heater element 124 is triggered by a control signal from the temperature controller 122 to increase the temperature of the in-line heater element 124. In the OFF state, the in-line heater element 124 is not triggered by a control signal from the temperature controller 122 to increase the temperature of the in-line heater element 124.

In another example embodiment, the temperature controller 122 is configured to identify initiation of the thermal drying process based on detection of the inert gas 140 flowing toward the probe compartment 128. For instance, flow of the inert gas 140 may be detected using a sensor at the flow rate controller 134. In accordance with this embodiment, the temperature controller 122 automatically causes the in-line heater element 124 to initiate heating of the inert gas 140 based on the initiation of the thermal drying process. In further accordance with this embodiment, the temperature controller 122 is configured to automatically cause the in-line heater element 124 to discontinue heating of the inert gas based on a discontinuation of the thermal drying process. In further accordance with this embodiment, the flow rate controller 134 is configured to automatically discontinue flow of the inert gas 140 into the temperature-controlled heating channel 126 based on the discontinuation of the thermal drying process.

In yet another example embodiment, the temperature controller 122 is configured to automatically cause the in-line heater element 124 to discontinue heating of the inert gas 140 based on a discontinuation of a supply of the inert gas 140. For instance, the temperature controller 122 generates control signals to control the solid state relay 132, which dictates whether the in-line heater element 124 is in an ON state or an OFF state. In the ON state, the in-line heater element 124 is capable of heating up in response to control signals that are received from the temperature controller 122. In the OFF state, the in-line heater element 124 is incapable of heating up in response to control signals that are received from the temperature controller 122. The temperature controller 122 may monitor an amount of the inert gas 140 that remains in a reservoir or a flow rate of the inert gas 140 through the flow rate controller 134 or into the temperature-controlled heating channel 126 to determine that the supply of the inert gas 140 is discontinued. The temperature controller 122 may automatically provide a control signal to the solid state relay 132 that causes the solid state relay 132 to set the in-line heater element 124 to the OFF state based on a determination that the supply of the inert gas 140 is discontinued.

The in-line heater element 124 converts electrical energy into heat. For instance, the in-line heater element 124 may include a resistive wire that produces heat based on a magnitude of current that flows through the wire. The in-line heater element 124 receives the control signals from the temperature controller 122 and heats up to the temperatures that correspond to the respective control signals at respective instances of time. For instance, the in-line heater element 124 may heat up to the first temperature at a first time instance based on receipt of the first control signal from the temperature controller 122; the in-line heater element 124 may heat up to the second temperature at a second time instance based on receipt of the second control signal from the temperature controller 122, and so on. In accordance with the current magnitude example mentioned above, the in-line heater element 124 may convert the current having the first magnitude into an amount of heat that causes the in-line heater element 124 to have the first temperature; the in-line heater element 124 may convert the current having the second magnitude into an amount of heat that causes the in-line heater element 124 to have the second temperature, and so on.

The temperature-controlled heating channel 126 receives the heated inert gas 142 from the in-line heater element 124 and the heated ambient air 146 from the fan/heater 136. The heated inert gas 142 and the heated ambient air 146 combine in the temperature-controlled heating channel 126 to provide a heated combination 148. The temperature-controlled heating channel 126 is coupled to the probe compartment 128 to guide the heated combination 148 (e.g., an entirety of the heated combination 148) into the probe compartment 128. For instance, the temperature-controlled heating channel 126 may be sealed (e.g., hermetically sealed) to the probe compartment 128, which may provide an airtight coupling between the temperature-controlled heating channel 126 and the probe compartment 128.

The probe compartment 128 contains the quantum circuit 148. The probe compartment 128 receives the heated combination 148, which progressively thermally dries the quantum circuit 148. For instance, the probe compartment 128 may serve as an enclosure that enables the heated combination 148 to surround (e.g., fully surround) the quantum circuit 148. The probe compartment 128 may be a hermetically sealed probe compartment, though the scope of the example embodiments is not limited in this respect. The quantum circuit may be any suitable type of quantum circuit, including but not limited to a cryogenic quantum circuit, a semiconductor quantum circuit, or a superconducting quantum circuit.

In an example embodiment, the probe compartment 128 is capable of housing probes of different sizes. The size of each probe corresponds to a size of a quantum circuit that the probe is configured to support. The size of a quantum circuit may be defined by an outside diameter, a length, a width, and/or an area of a surface of the quantum circuit. Adapters that are configured to fit the respective probes may be interchanged in the probe compartment to accommodate thermal drying of the different-sized quantum circuits.

The manual control 130 enables a user of the progressive thermal drying chamber 100 to manually set variables associated with the thermal drying process, such as any one or more of the variables mentioned above with respect to the remote control 114.

The solid state relay 132 toggles the in-line heater element 124 between an ON state and an OFF state. The solid state relay 132 sets the in-line heater element 124 to be in the ON state or the OFF state based on control signals that are received from the temperature controller 122.

The flow rate controller 134 (a.k.a. inert gas flow rate controller) controls a rate at which the inert gas 140 flows into the temperature-controlled heating channel 126. For instance, the flow rate controller 134 may set the rate at which the inert gas 140 flows into the temperature-controlled heating channel 126 based on control signals that are received from the control circuitry 108, the remote control 114, or the manual control 130. By controlling the rate at which the inert gas 140 flows into the temperature-controlled heating channel 126, the flow rate controller 134 may cause the heated combination 148 to have a relative humidity less than or equal to a relative humidity threshold. For instance, the relative humidity threshold may be a relative humidity at which water condensation occurs (e.g., begins) on an outer surface of the quantum circuit 148.

The fan/heater 136 includes a heater that heats the ambient air 144 to provide the heated ambient air 146. The fan/heater 136 further includes a fan that blows the heated ambient air 146 into the temperature-controlled heating channel 126.

The flow rate controller 138 (a.k.a. ambient air flow rate controller) controls a rate at which the ambient air 144 flows through the fan/heater 136. For instance, the flow rate controller 138 may set the rate at which the ambient air 144 flows through the fan/heater 136 based on control signals that are received from the control circuitry 108, the remote control 114, or the manual control 130.

The various components of the progressive thermal drying chamber 100 shown in FIG. 1 may be implemented in hardware, software, firmware, or any combination thereof. For example, component(s) may be implemented as computer program code configured to be executed in one or more processors. In another example, component(s) may be implemented as hardware logic/electrical circuitry. For instance, component(s) may be implemented in a field-programmable gate array (FPGA), an application-specific integrated circuit (ASIC), an application-specific standard product (ASSP), a system-on-a-chip system (SoC), a complex programmable logic device (CPLD), etc. Each SoC may include an integrated circuit chip that includes one or more of a processor (a microcontroller, microprocessor, digital signal processor (DSP), etc.), memory, one or more communication interfaces, and/or further circuits and/or embedded firmware to perform its functions.

It will be recognized that the progressive thermal drying chamber 100 may not include one or more of the components shown in FIG. 1. Furthermore, the progressive thermal drying chamber 100 may include components in addition to or in lieu of the components shown in FIG. 1.

Figures 2A, 2B:
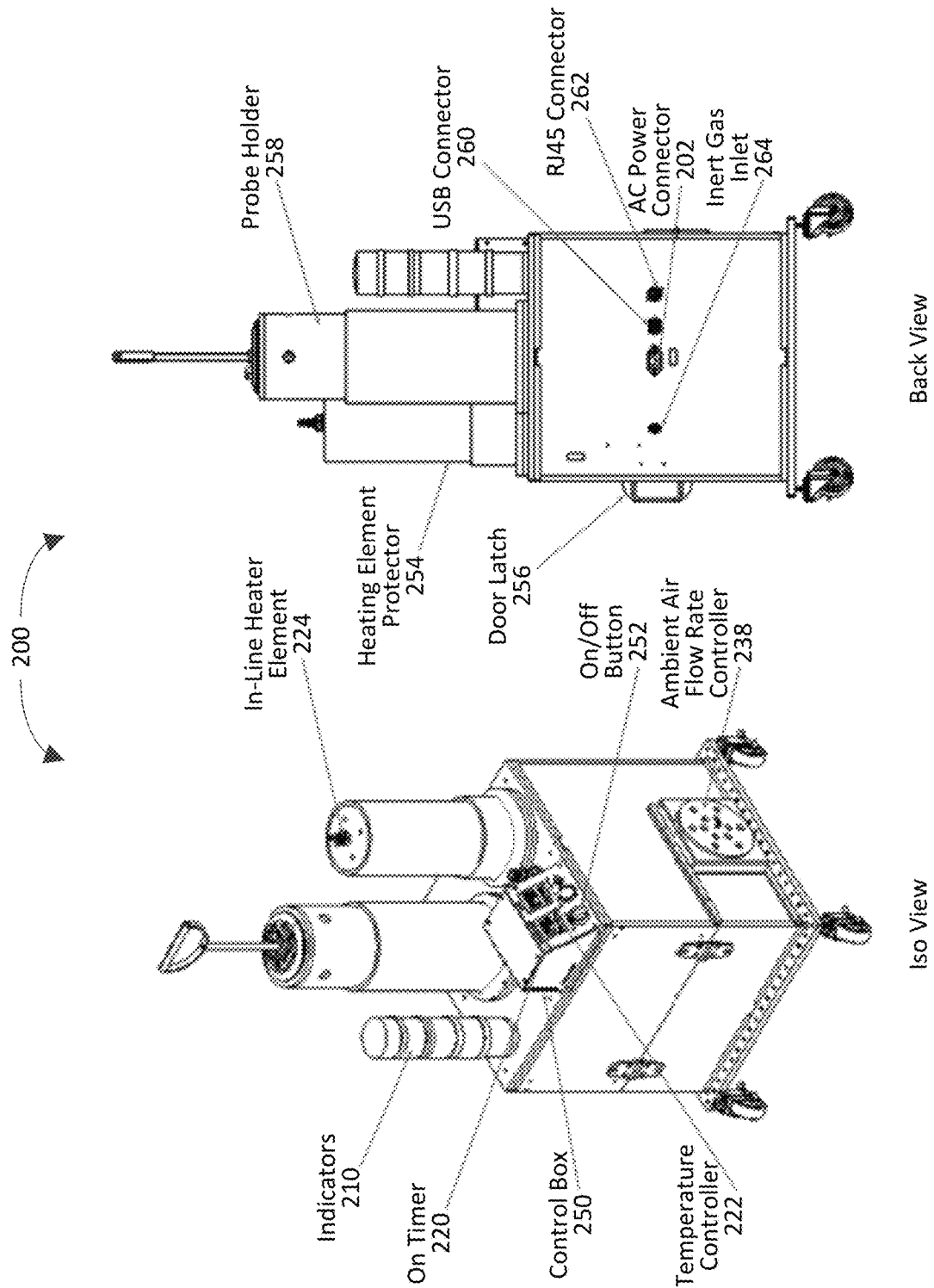
FIGS. 2A-2B depict an iso view and a back view of an example progressive thermal drying chamber in accordance with an embodiment.

FIGS. 2A-2B depict an iso view and a back view of an example progressive thermal drying chamber 200 in accordance with an embodiment. As shown in FIGS. 2A-2B, the progressive thermal drying chamber 200 includes an AC power connector 202, indicators 210, an on timer 220, a temperature controller 222, an in-line heater element 224, and an ambient air flow rate controller 238, which are operable in a manner similar to the AC IN 102, the indicators 110a-110d, the timer 120, the temperature controller 122, the in-line heater element 124, and the ambient air flow rate controller 138 described above with reference to FIG. 1. The progressive thermal drying chamber 200 is shown to further include a control box 250, an on/off button 252, a heating element protector 254, a door latch 256, a probe holder 258, a USB connector 260, an RJ45 connector 262, and an inert gas inlet 264.

The control box 250 houses the on timer 220 and the temperature controller 222. The on/off button 252 is located on the control box 250 and is capable of being toggled between an ON state and an OFF state manually by a user of the progressive thermal drying chamber 200. In the ON state, the progressive thermal drying chamber 200 is capable of thermally drying a quantum circuit. In the OFF state, the progressive thermal drying chamber 200 is incapable of thermally drying the quantum circuit.

The heating element protector 254 provides a structure around the in-line heater element 224 to protect the in-line heater element 224 from damage.

The door latch 256 secures a door that provides access to a variety of components within the progressive thermal drying chamber 200. For instance, the user may disengage (e.g., lift, turn, or pull) the latch to open the door, which provides access the components therein.

The probe holder 258 secures a probe, including a probe compartment that includes the quantum circuit, in a fixed position during the thermal drying process.

The universal serial bus (USB) connector 260 is configured to connect to a USB cable or a USB device. For instance, information regarding the thermal drying process (e.g., variable values; measured temperature data, time data, gas flow data) may be transmitted and received via the USB connector 260.

The registered jack 45 (RJ45) connector 262 is configured to connect to an Ethernet cable. For instance, information regarding the thermal drying process may be transmitted and received via the RJ45 connector 262.

The inert gas inlet 264 receives inert gas from a reservoir. For instance, a tube may be connected between the reservoir and the inert gas inlet 264 to enable the inert gas to flow into the progressive thermal drying chamber 200.

FIGS. 3A-3B depict a back view and a front view of an example progressive thermal drying chamber 300 in accordance with an embodiment. As shown in FIGS. 3A-3B, the progressive thermal drying chamber 300 includes an AC power connector 302, control circuitry 308, indicators 310, an on timer 320, a temperature controller 322, an in-line heater element 324, a temperature-controlled heating channel 326, a probe compartment 328, an inert gas flow rate controller 334, a fan/heater 336, and an ambient air flow sliding window 338, which are operable in a manner similar to the AC IN 102, the control circuitry 108, the indicators 110a-110d, the timer 120, the temperature controller 122, the in-line heater element 124, the temperature-controlled heating channel 126, the probe compartment 128, the flow rate controller 134, the fan/heater 136, and the flow rate controller 138 described above with reference to FIG. 1. The progressive thermal drying chamber 300 further includes an on/off button 352, a USB connector 360, an RJ45 connector 362, and an inert gas inlet 364, which are operable in manner similar to the on/off button 252, the USB connector 260, the RJ45 connector 262, and the inert gas inlet 264 described above with reference to FIGS. 2A-2B. The progressive thermal drying chamber 300 is shown to further include a safety protection thermistor and thermocouples 370, a period off timer 372, and an inert gas regulator and sensors 374.

The safety protection thermistor and thermocouples 370 function as a temperature sensor. For instance, the safety protection thermistor and thermocouples 370 detect the temperature of the in-line heater element 324. Resistance of the thermistor is dependent on the temperature. The thermistor may have a negative temperature coefficient such that the resistance of the thermistor decreases as the temperature increases, or the thermistor may have a positive temperature coefficient such that the resistance of the thermistor increases as the temperature increases. The thermocouples generate a voltage that is dependent on the temperature in accordance with Seebeck effect. The resistance of the thermistor and the voltage generated by the thermocouples provide a measure of the temperature of the in-line heater element 324.

The period off timer 372 tracks an amount of time that a notification (e.g., alarm) is generated by an indicator (e.g., any of the indicators 310) and automatically turns off the notification based on the amount of time reaching a time threshold. For instance, if the off timer 372 is configured to allow a notification, which indicates that the thermal drying process is complete, to continue for a duration of 10 minutes, the off timer 372 may start a clock at a time instance at which the notification begins and may provide a control signal to the indicator to stop the notification based on the clock reaching 10 minutes.

The inert gas regulator and sensors 374 detect inert gas, measure a flow of the inert gas (e.g., an amount of the inert gas that flows into the temperature-controlled heating channel 326, and control a pressure with which the inert gas flows into the temperature-controlled heating channel 326.

Figure 4:
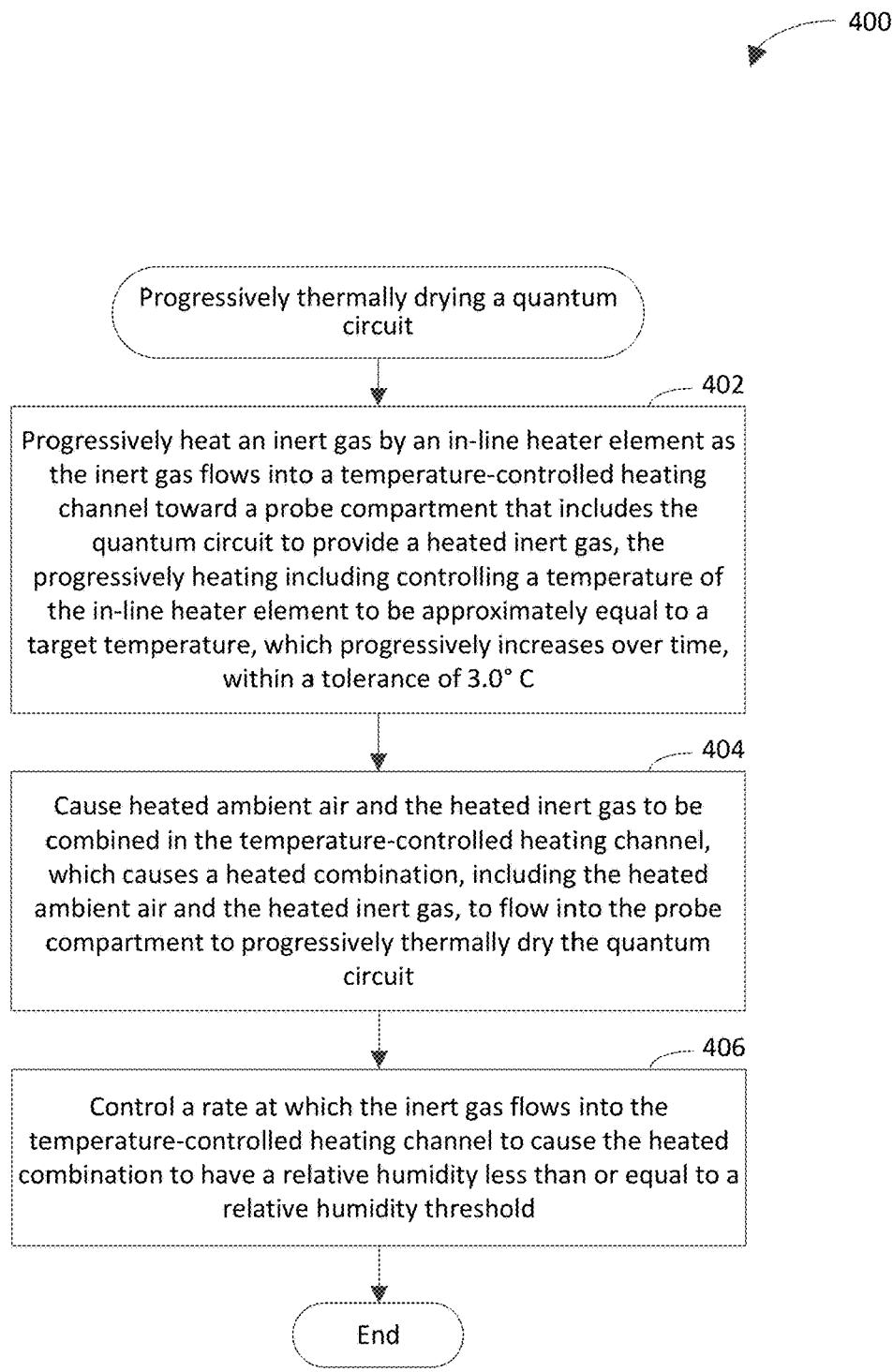
FIGS. 4-6 depict flowcharts of example methods for progressively thermally drying a quantum circuit in accordance with embodiments.
Figure 5:
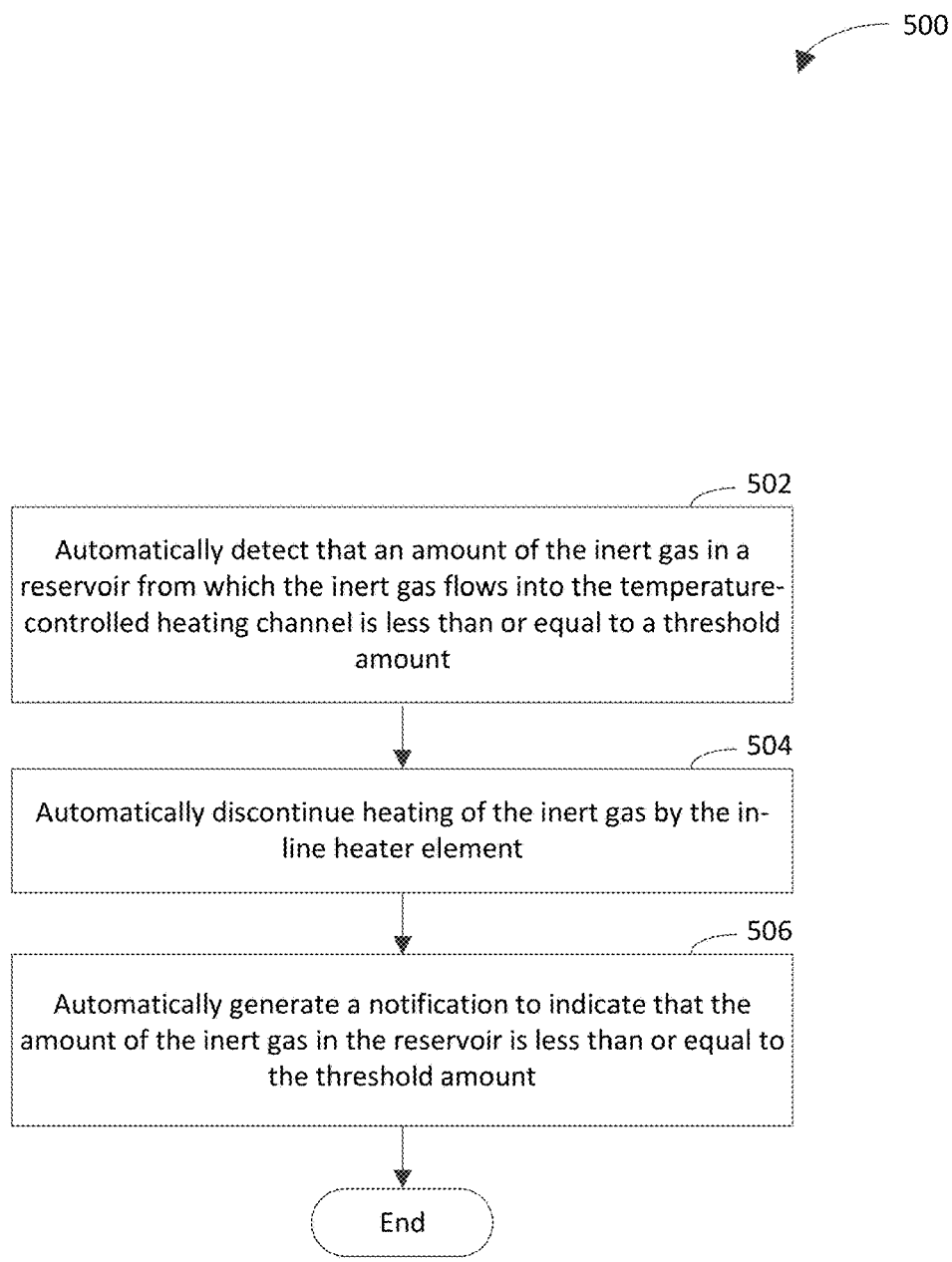
Figure 6:
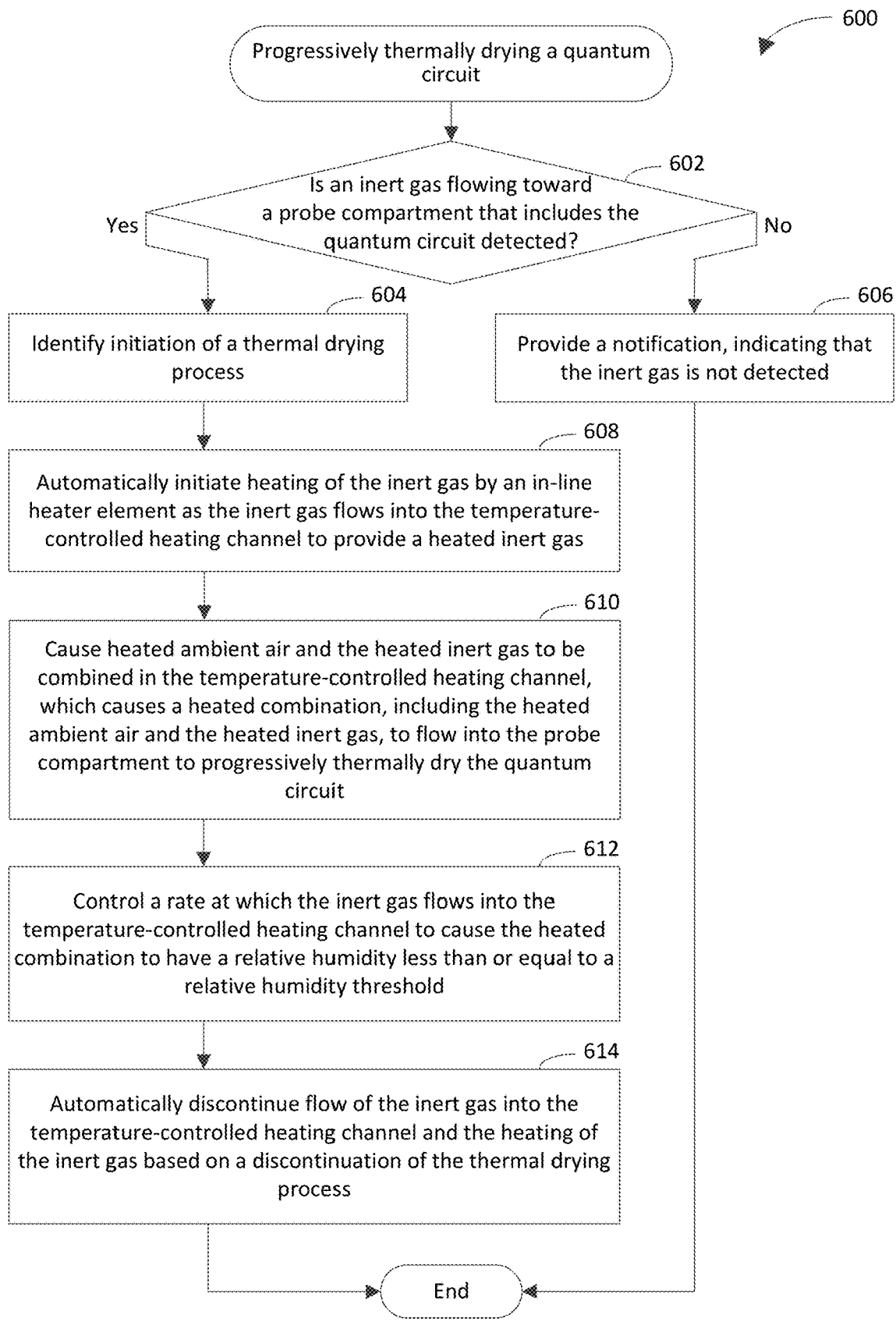

FIGS. 4-6 depict flowcharts 400, 500, and 600 of example methods for progressively thermally drying a quantum circuit in accordance with embodiments. Flowcharts 400, 500, and 600 may be performed by the progressive thermal drying chamber 100 shown in FIG. 1, the progressive thermal drying chamber 200 shown in FIGS. 2A-2B, or the progressive thermal drying chamber 300 shown in FIGS. 3A-3B, for example. For illustrative purposes, flowcharts 400, 500, and 600 are described with respect to the progressive thermal drying chamber 100 shown in FIG. 1. Further structural and operational embodiments will be apparent to persons skilled in the relevant art(s) based on the discussion regarding flowcharts 400, 500, and 600.

As shown in FIG. 4, the method of flowchart 400 begins at step 402. In step 402, an inert gas (e.g., gaseous nitrogen or gaseous helium) is progressively heated by an in-line heater element as the inert gas flows into a temperature-controlled heating channel toward a probe compartment that includes the quantum circuit to provide a heated inert gas. The progressively heating includes controlling a temperature of the in-line heater element to be approximately equal to a target temperature, which progressively increases over time, within a tolerance of 3.0° C. The progressively heating may further include maintaining a temperature of the heated inert gas in the temperature-controlled heating channel within the aforementioned tolerance, though the scope of the example embodiments is not limited in this respect. In some example embodiments, the tolerance is less than 3.0° C. For instance, the tolerance may be 2.2° C., 1.7° C., 1.2° C., 0.7° C., 0.4° C., 0.3° C., or 0.08° C.

In an example implementation, the temperature controller 122 and the in-line heater element 124 collaboratively progressively heat an inert gas 140 as the inert gas 140 flows into a temperature-controlled heating channel 126 toward a probe compartment 128 that includes a quantum circuit 148 to provide a heated inert gas 142. For example, the temperature controller 122 may generate a current having a magnitude that progressively increases over time. In accordance with this example, the temperature of the in-line heater element 124 may progressively increase based on the progressively increasing magnitude of the current that is received from the temperature controller 122. In further accordance with this example, the progressively increasing temperature of the in-line heater element 124 may progressively heat the inert gas 140 as the inert gas 140 flows into the temperature-controlled heating channel 126. In accordance with this implementation, the temperature controller 122 controls the temperature of the in-line heater element 124 to be approximately equal to the target temperature, which progressively increases over time, within the tolerance of 3.0° C.

At step 404, heated ambient air and the heated inert gas are caused to be combined in the temperature-controlled heating channel, which causes a heated combination, including the heated ambient air and the heated inert gas, to flow into the probe compartment to progressively thermally dry the quantum circuit. In an example implementation, any one or more of the flow rate controller 134, the flow rate controller 138, and/or the control circuitry 108 are said to cause heated ambient air 146 and the heated inert gas 142 to be combined in the temperature-controlled heating channel 126, which causes a heated combination 148, including the heated ambient air 146 and the heated inert gas 142, to flow into the probe compartment 128 to progressively thermally dry the quantum circuit 148.

At step 406, a rate at which the inert gas flows into the temperature-controlled heating channel is controlled to cause the heated combination to have a relative humidity less than or equal to a relative humidity threshold. For instance, the rate may be controlled based on (e.g., based at least in part on) a target temperature of the in-line heater element. In an example implementation, the flow rate controller 134 controls a rate at which the inert gas 140 flows into the temperature-controlled heating channel 126 to cause the heated combination 148 to have a relative humidity less than or equal to the relative humidity threshold. In an example, the control circuitry 108 may provide a control signal to the flow rate controller 134. The control signal may indicate the rate at which the inert gas 140 is to flow into the temperature-controlled heating channel 126. In accordance with this example, the flow rate controller 134 may set the rate at which the inert gas 140 flows into the temperature-controlled heating channel 126 based on the rate that is indicated by the control signal that is received from the control circuitry 108. In further accordance with this example, the control circuitry 108 may be said to control the rate at which the inert gas 140 flows into the temperature-controlled heating channel 126 to cause the heated combination 148 to have a relative humidity less than or equal to the relative humidity threshold.

In an example embodiment, controlling the rate at which the inert gas flows into the temperature-controlled heating channel at step 406 includes controlling a pressure with which the inert gas is injected into the temperature-controlled heating channel.

In some example embodiments, one or more steps 402, 404, and/or 406 of flowchart 400 may not be performed. Moreover, steps in addition to or in lieu of steps 402, 404, and/or 406 may be performed. For instance, in an example embodiment, the method of flowchart 400 further includes controlling a rate (e.g., volume per unit time) at which the heated ambient air flows into the temperature-controlled heating channel to cause the heated combination to have the relative humidity less than or equal to the relative humidity threshold.

In an example implementation, the flow rate controller 138 controls the rate at which the heated ambient air 146 flows into the temperature-controlled heating channel 126 to cause the heated combination 148 to have the relative humidity less than or equal to the relative humidity threshold. In accordance with this implementation, the flow rate controller 138 may have openings through which the ambient air 138 flows. An area (e.g., diameter) of the openings may dictate an amount (e.g., volume) of the ambient air 144 that flows through the flow rate controller 138 per unit time, thereby controlling the rate at which the heated ambient air 146 flows into the temperature-controlled heating channel 126.

In another example implementation, the control circuitry 108 controls the rate at which the heated ambient air 144 flows into the temperature-controlled heating channel 126. For example, the control circuitry 108 may generate a control signal that indicates the rate at which the heated ambient air 146 is to flow into the temperature-controlled heating channel 126. For instance, a voltage, current, phase, or frequency of the control signal may indicate the rate. In accordance with this example, the control signal may cause the openings in the flow rate controller 138 to have an area that corresponds to the rate indicated by the control signal. For instance, the control signal may control a motor that sets the area of the openings to achieve the rate based on the control signal.

In another embodiment, the method of flowchart 400 further includes automatically generating a notification, which indicates that the quantum circuit is being thermally dried, based at least in part on the inert gas being progressively heated by the in-line heater element. In an example implementation, the control circuitry 108 generates the notification, indicating that the quantum circuit 148 is being thermally dried, as a result of the inert gas 140 being progressively heated by the in-line heater element 124. For example, the control circuitry 108 may generate a control signal that causes the temperature controller 122 to increase the temperature of the in-line heater element 124. In accordance with this example, the control circuitry 108 may generate the notification based on the control signal being sent to the temperature controller 122. In another example, the control circuitry 108 may monitor a thermometer that is configured to detect a temperature of the in-line heater element 124. In accordance with this example, the control circuitry 108 may generate the notification based on the temperature of the in-line heater element 124, as indicated by the thermometer, being greater than or equal to a threshold temperature. In further accordance with this example, the control circuitry 108 may further monitor a flow of the inert gas 140 as it passes by the in-line heater element 124, and the control circuitry 108 may generate the notification further based on the flow of the inert gas 140 being detected (e.g., the rate of flow of the inert gas 140 being greater than or equal to a rate threshold). The notification (and any other notifications described herein) may include an audible alarm (e.g., warbling tone, beeping tone) and/or a visual alarm (flashing/blinking light, steady light, light of a designated color (e.g., red, amber, green), text message).

In yet another example embodiment, the method of flowchart 400 further includes automatically generating a notification, which indicates that thermal drying of the quantum circuit is complete, based at least in part on passage of a specified amount of time that begins at a time instance at which the inert gas begins to flow into the temperature-controlled heating channel. In an example implementation, the control circuitry 108 generates the notification, indicating that the thermal drying of the quantum circuit 148 is complete, based at least in part on passage of a specified amount of time that begins at a time instance at which the inert gas 140 (e.g., the heated inert gas 142) begins to flow into the temperature-controlled heating channel 126. For example, the timer 120 may keep track of the elapsed time since the heated inert gas 142 began to flow into the temperature-controlled heating channel 126, and the control circuitry 108 may monitor the elapsed time indicated by the timer 120. In accordance with this example, the control circuitry 108 may generate the notification based on the elapsed time reaching the specified amount of time. The specified amount of time may be any suitable value, including but not limited to 30 minutes, 45 minutes, 50 minutes, or one hour.

In an aspect of this embodiment, automatically generating the notification includes automatically initiating an alarm, including an audible alarm and/or a visual alarm. In accordance with this aspect, the method of flowchart 400 further includes automatically discontinuing the alarm based at least in part on passage of a designated amount of time that begins at a time instance at which the alarm is initiated. In an example implementation, the control circuitry 108 automatically discontinues the alarm. For example, the timer 120 may keep track of the elapsed time since the alarm was initiated, and the control circuitry 108 may monitor the elapsed time indicated by the timer 120. In accordance with this example, the control circuitry 108 may automatically discontinue the alarm based on the elapsed time since the alarm was initiated reaching the designated amount of time. The designated amount of time may be any suitable value, including but not limited to 5 minutes, 10 minutes, 15 minutes, or 30 minutes.

In still another example embodiment, the method of flowchart 400 further includes one or more of the steps shown in flowchart 500 of FIG. 5. As shown in FIG. 5, the method of flowchart 500 begins at step 502. In step 502, it is automatically detected that an amount of the inert gas in a reservoir from which the inert gas flows into the temperature-controlled heating channel is less than or equal to a threshold amount. In an example implementation, the temperature controller 122 automatically detects that the amount of the inert gas 140 in the reservoir is less than or equal to the threshold amount. For instance, the temperature controller 122 may monitor the amount of the inert gas 140 in the reservoir and compare the amount to the threshold amount to make the determination.

At step 504, heating of the inert gas by the in-line heater element is automatically discontinued (e.g., based at least in part on detection that the amount of the inert gas in the reservoir is less than or equal to the threshold amount). For instance, automatically discontinuing the heating of the inert gas may include automatically discontinuing excitation of the in-line heater element by a temperature controller that controls a temperature of the in-line heater element. In an example implementation, the temperature controller 122 automatically discontinues heating of the inert gas 140 by the in-line heater element 124. In an aspect of this example, the temperature controller 122 may automatically discontinue providing a control signal (e.g., a current signal), which causes the in-line heater element 124 to heat up, to the in-line heater element 124. In another aspect of this example, the temperature controller 122 may automatically generate a control signal that causes the solid state relay 132 to set the in-line heater element 124 to the OFF state.

At step 506, a notification is automatically generated to indicate that the amount of the inert gas in the reservoir is less than or equal to the threshold amount. In an example implementation, the control circuitry 108 automatically generates the notification. For instance, the temperature controller 122 may provide an indicator to the control circuitry 108, indicating that the amount of the inert gas in the reservoir is less than or equal to the threshold amount. The control circuitry 108 may generate the notification based on receipt of the indicator from the temperature controller 122.

As shown in FIG. 6, the method of flowchart 600 begins at step 602. In step 602, a determination is made whether an inert gas is flowing toward a probe compartment that includes the quantum circuit. If the inert gas is flowing toward the probe compartment, flow continues to step 604. Otherwise, flow continues to step 606. In an example implementation, the control circuitry 108 determines that inert gas 140 is flowing toward a probe compartment 128 that includes the quantum circuit 148. For instance, the control circuitry 108 may be coupled to a sensor that is attached to the flow rate controller 134 or the temperature-controlled heating channel 126, and the sensor may be configured to detect flow of an inert gas. The control circuit 108 may determine that the inert gas 140 is flowing toward the probe compartment 128 based on a signal that is received from the sensor. For example, the signal may indicate that the inert gas 140 is detected.

At step 604, initiation of a thermal drying process is identified. In an example implementation, the control circuitry 108 identifies the initiation of the thermal drying process based on a determination that the inert gas 140 is flowing toward the probe compartment 128.

At step 606, a notification, indicating that the inert gas is not identified, is provided. Upon completion of step 606, the method of flowchart 600 ends. In an example implementation, the control circuitry 108 provides the notification. For example, the control circuitry 108 may generate a control signal to activate any one or more of the indicators 110a-110d. In accordance with this example, the notification is provided by activating any one or more of the indicators 110a-110d.

At step 608, heating of the inert gas by an in-line heater element as the inert gas flows into the temperature-controlled heating channel is automatically initiated to provide a heated inert gas based on the initiation of the thermal drying process. In an example implementation, the temperature controller 122 automatically initiates heating of the inert gas 140 by the in-line heater element 124 as the inert gas 140 flows into the temperature-controlled heating channel 126 to provide the heated inert gas 142. For example, the control circuitry 108 may provide a notification signal to the temperature controller 122, indicating that the thermal drying process has been initiated. In accordance with this example, the temperature controller 122 may provide a control signal to the in-line heater element 124 to automatically initiate the heating of the inert gas 140 by the in-line heater element 124 based on receipt of the notification signal from the control circuitry 108. By providing the control signal to the in-line heater element 124, the temperature controller 122 causes the temperature of the in-line heater element 124 to increase, and the increased temperature of the in-line heater element 124 heats the inert gas 140.

At step 610, heated ambient air and the heated inert gas are caused to be combined in the temperature-controlled heating channel, which causes a heated combination, including the heated ambient air and the heated inert gas, to flow into the probe compartment to progressively thermally dry the quantum circuit. In an example implementation, the control circuitry 108 causes heated ambient air 146 and the heated inert gas 142 to be combined in the temperature-controlled heating channel 126, which causes a heated combination 148, including the heated ambient air 146 and the heated inert gas 142, to flow into the probe compartment 128 to progressively thermally dry the quantum circuit 148. For instance, the control circuitry 108 may provide control signals to the temperature controller 122, the in-line heater element 124, the fan/heater 136, the flow rate controller 134, and/or the flow rate controller 138 to cause the heated ambient air 146 and the heated inert gas 142 to flow into the temperature-controlled heating channel 126 and to be combined therein.

At step 612, a rate at which the inert gas flows into the temperature-controlled heating channel is controlled to cause the heated combination to have a relative humidity less than or equal to a relative humidity threshold. In an example implementation, the flow rate controller 134 and/or the control circuitry 108 controls a rate at which the inert gas 140 flows into the temperature-controlled heating channel 126 to cause the heated combination 148 to have a relative humidity less than or equal to the relative humidity threshold.

At step 614, flow of the inert gas into the temperature-controlled heating channel and the heating of the inert gas are automatically discontinued based on a discontinuation of the thermal drying process. For instance, the thermal drying process may be discontinued based on a specified amount of time (e.g., 25 minutes, 40 minutes, or 55 minutes) elapsing since the initiation of the thermal drying process was identified. In an example implementation, the control circuitry 108 and/or the flow rate controller 134 automatically discontinues flow of the inert gas 140 into the temperature-controlled heating channel 126 based on the discontinuation of the thermal drying process. For example, the control circuitry 108 may determine that the thermal drying process is discontinued (e.g., based on a specified period of time ending). In accordance with this example, the control circuitry 108 may provide a control signal to the flow rate controller 134, which causes the flow rate controller 134 to stop the flow of the inert gas 140 (e.g., the heated inert gas 142) into the temperature-controlled heating channel 126. In accordance with this example implementation, the control circuitry 108, the temperature controller 122, and/or the solid state relay 132 automatically discontinues heating of the inert gas 140. For instance, any one or more of the control circuitry 108, the temperature controller 122, and/or the solid state relay 132 may provide a control signal to the in-line heater element to set the in-line heater element 124 to an OFF state in which the in-line heater element 124 is incapable of heating up to heat the inert gas 140.

In some example embodiments, one or more steps 602, 604, 606, 608, 610, 612, and/or 614 of flowchart 600 may not be performed. Moreover, steps in addition to or in lieu of steps 602, 604, 606, 608, 610, 612, and/or 614 may be performed. For instance, in an example embodiment, the method of flowchart 600 further includes automatically progressively increasing an intensity of thermal energy that is applied to the inert gas by the in-line heater element over time to increase a temperature of the heated inert gas. The automatically progressively increasing the intensity of the thermal energy includes automatically controlling a temperature of the in-line heater element to be approximately equal to a reference temperature, which progressively increases during the thermal drying process, within a targeted tolerance. For instance, the targeted tolerance may be 3.0° C., 2.5° C., 2.0° C., 1.5° C., 1.0° C., 0.5° C., 0.2° C., or 0.1° C. In an example implementation, the temperature controller 122 automatically progressively increases the intensity of the thermal energy that is applied to the inert gas 140 by the in-line heater element 124 over time to increase the temperature of the heated inert gas 142. For instance, the temperature controller 122 may generate a current to control an intensity of the thermal energy that the in-line heater element 124 applies to the inert gas 140, and the temperature controller 122 may progressively increase a magnitude of the current over time to cause the intensity of the thermal energy that the in-line heater element 124 applies to the inert gas 140 to automatically progressively increase over time. The progressively increasing intensity of the thermal energy causes the temperature of the heated inert gas 142 to increase. In accordance with this implementation, the temperature controller 122 automatically controls the temperature of the in-line heater element 124 to be approximately equal to the reference temperature within the targeted tolerance.

In another example embodiment, the method of flowchart 600 further includes automatically controlling a rate at which the heated ambient air flows into the temperature-controlled heating channel to cause the heated combination to have the relative humidity less than or equal to the relative humidity threshold. In an example implementation, the control circuitry 108 and/or the flow rate controller 138 controls the rate at which the heated ambient air 146 flows into the temperature-controlled heating channel 126 to cause the heated combination 148 to have the relative humidity less than or equal to the relative humidity threshold. For example, the control circuitry 108 may generate a control signal that indicates the rate at which the heated ambient air 146 is to flow into the temperature-controlled heating channel 126, and the flow rate controller 138 may modify openings therein to have an area that corresponds to the rate indicated by the control signal. In accordance with this example, the area of the openings in the flow rate controller 138 dictates the rate at which the heated ambient air 146 flows into the temperature-controlled heating channel 126.

In yet another example embodiment, the method of flowchart 600 further includes automatically generating a notification, which indicates that the thermal drying process is in progress, based at least in part on identifying the initiation of the thermal drying process. In an example implementation, the control circuitry 108 automatically generates the notification as a result of identifying the initiation of the thermal drying process. For example, the control circuitry 108 may generate a control signal that activates any one or more of the indicators 110a-110d. Activation of an indicator may cause the indicator to generate an audible alarm (e.g., warbling tone, beeping tone) and/or a visual alarm (flashing/blinking light, steady light, light of a designated color (e.g., red, amber, green), text message).

In still another example embodiment, the method of flowchart 600 further includes automatically generating a notification, which indicates that the thermal drying process is discontinued, based at least in part on the discontinuation of the thermal drying process. In an example implementation, the control circuitry 108 automatically generates the notification as a result of determining that the thermal drying process is discontinued.

In an aspect of this embodiment, automatically generating the notification includes automatically initiating an alarm, which indicates that the thermal drying process is discontinued, based at least in part on the discontinuation of the thermal drying process. In accordance with this aspect, the alarm includes an audible alarm and/or a visual alarm. In further accordance with this aspect, the method of flowchart 600 further includes automatically discontinuing the alarm based at least in part on passage of a designated amount of time that begins at a time instance at which the alarm is initiated. In an example implementation, the control circuitry 108 automatically discontinues the alarm based at least in part on the passage of the designated amount of time. For example, the control circuitry 108 may receive a notification signal from the timer 120, indicating that the designated amount of time has passed. In accordance with this example, the control circuitry 108 may automatically discontinues the alarm based on receipt of the notification signal (e.g., based on the notification signal indicating that the designated amount of time has passed).

In another example embodiment, the method of flowchart 600 further includes monitoring a temperature of the in-line heater element during the thermal drying process. In an example implementation, the control circuitry 108 monitors a temperature of the in-line heater element 124 during the thermal drying process. In accordance with this embodiment, the method of flowchart 600 further includes automatically triggering the discontinuation of the thermal drying process based at least in part on the temperature reaching a temperature threshold. The temperature threshold may be any suitable value, including but not limited to 120° F., 150° F., or 160° F. In an example implementation, the control circuitry 108 automatically triggers the discontinuation of the thermal drying process based at least in part on the temperature reaching a temperature threshold.

In yet another example embodiment, the method of flowchart 600 further includes causing a setup interface to be presented to a user via a network. The setup interface enables the user to set at least one of the following: (1) a temperature to which the in-line heater element is to be heated; (2) a maximum temperature, which corresponds to the in-line heater element, at which the temperature controller is configured to automatically cause the in-line heater element to discontinue heating of the inert gas; (3) the relative humidity threshold; (4) a duration of the thermal drying process. In an example implementation, the control circuitry 108 causes the setup interface to be presented to the user via the network. In response to the setup interface being presented to the user, the control circuitry 108 may receive instructions from the user via the network, identifying value(s) selected by the user for any one or more of the variables mentioned above. The control circuitry 108 may set the variable(s) to have the respective value(s) that are identified in the instructions.

In still another example embodiment, the method of flowchart 600 further includes causing a monitoring interface to be presented to a user via a network. The monitoring interface enables the user to monitor at least one of the following: (1) an amount of the inert gas in a reservoir from which the inert gas flows into the temperature-controlled heating; (2) a setpoint temperature of the in-line heater element; (3) a progressive temperature of the in-line heater element; (4) the relative humidity of the heated combination; (5) an amount of time (e.g., elapsed time) since initiation of the thermal drying process. The setpoint temperature is an initial temperature to which the in-line heater element is set. A progressive temperature is a temperature, which is greater than the setpoint temperature, to which the in-line heater element is set after the in-line heater element is set to the setpoint temperature. In an example implementation, the control circuitry 108 causes the monitoring interface to be presented to the user via the network. For instance, the control circuitry 108 may detect or gather the information mentioned above and incorporate the information into the monitoring interface. The control circuitry 108 may update the information in real-time (e.g., continuously).

In yet another example embodiment, the method of flowchart 600 further includes one or more of the steps shown in flowchart 500 of FIG. 5, which is described above.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods may be used in conjunction with other methods.

The components in the progressive thermal drying chamber 100, the components in the progressive thermal drying chamber 200, the components in the progressive thermal drying chamber 300, flowchart 400, flowchart 500, and/or flowchart 600 may be implemented in hardware, software, firmware, or any combination thereof.

For example, any one or more of the components in the progressive thermal drying chamber 100, any one or more of the components in the progressive thermal drying chamber 200, any one or more of the components in the progressive thermal drying chamber 300, flowchart 400, flowchart 500, and/or flowchart 600 may be implemented, at least in part, as computer program code configured to be executed in one or more processors.

In another example, any one or more of the components in the progressive thermal drying chamber 100, any one or more of the components in the progressive thermal drying chamber 200, any one or more of the components in the progressive thermal drying chamber 300, flowchart 400, flowchart 500, and/or flowchart 600 may be implemented, at least in part, as hardware logic/electrical circuitry. Such hardware logic/electrical circuitry may include one or more hardware logic components. Examples of a hardware logic component include but are not limited to a field-programmable gate array (FPGA), an application-specific integrated circuit (ASIC), an application-specific standard product (ASSP), a system-on-a-chip system (SoC), a complex programmable logic device (CPLD), etc. For instance, a SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

III. Further Discussion of Some Example Embodiments (A1) An example progressive thermal drying chamber (FIG. 1, 100; FIG. 2, 200; FIG. 3, 300) comprising: a probe compartment (FIG. 1, 128; FIG. 3, 328) configured to house a quantum circuit (FIG. 1, 148) during a thermal drying process; a temperature-controlled heating channel (FIG. 1, 126; FIG. 3, 326) coupled to the probe compartment and configured to provide a heated combination (FIG. 1, 148), which includes heated ambient air (FIG. 1, 146) and a heated inert gas (FIG. 1, 142), to the probe compartment; an in-line heater element (FIG. 1, 124; FIG. 2, 224; FIG. 3, 324) configured to heat an inert gas (FIG. 1, 140) to provide the heated inert gas; a temperature controller (FIG. 1, 122; FIG. 2, 222; FIG. 3, 322) configured to control a temperature of the in-line heater element such that the in-line heater element progressively heats the inert gas as the inert gas flows into the temperature-controlled heating channel; a flow rate controller (FIG. 1, 134; FIG. 3, 334) configured to control a rate at which the inert gas flows into the temperature-controlled heating channel to cause the heated combination to have a relative humidity less than or equal to a relative humidity threshold; and electronic control circuitry (FIG. 1, 108; FIG. 3, 308) configured to control the in-line heater element and the temperature controller, wherein the electronic control circuitry is external to the temperature-controlled heating channel.

(A2) In the example progressive thermal drying chamber of A1, wherein the temperature controller is configured to control the temperature of the in-line heater element to track a progressively increasing target temperature within a tolerance of 3.0° C.

(A3) In the example progressive thermal drying chamber of any of A1-A2, wherein the temperature controller is configured to identify initiation of the thermal drying process based on detection of the inert gas flowing toward the probe compartment; wherein the temperature controller is configured to automatically cause the in-line heater element to initiate heating of the inert gas based on the initiation of the thermal drying process; wherein the temperature controller is configured to automatically cause the in-line heater element to discontinue heating of the inert gas based on a discontinuation of the thermal drying process; and wherein the flow rate controller is configured to automatically discontinue flow of the inert gas into the temperature-controlled heating channel based on the discontinuation of the thermal drying process.

(A4) In the example progressive thermal drying chamber of any of A1-A3, wherein the temperature controller is configured to automatically cause the in-line heater element to discontinue heating of the inert gas based on a discontinuation of a supply of the inert gas.

(A5) In the example progressive thermal drying chamber of any of A1-A4, wherein the probe compartment is capable of housing probes of different sizes, the size of each probe corresponding a size of a quantum circuit that the probe is configured to support.

(B1) An example method of progressively thermally drying a quantum circuit quantum circuit (FIG. 1, 148), the method comprising: progressively heating (FIG. 4, 402) an inert gas (FIG. 1, 140) by an in-line heater element (FIG. 1, 124; FIG. 2, 224; FIG. 3, 324) as the inert gas flows into a temperature-controlled heating channel (FIG. 1, 126; FIG. 3, 326) toward a probe compartment (FIG. 1, 128; FIG. 3, 328) that includes the quantum circuit to provide a heated inert gas (FIG. 1, 142), the progressively heating including controlling a temperature of the in-line heater element to be approximately equal to a target temperature, which progressively increases over time, within a tolerance of 3.0° C.; causing (FIG. 4, 404) heated ambient air (FIG. 1, 146) and the heated inert gas to be combined in the temperature-controlled heating channel, which causes a heated combination (FIG. 1, 148), including the heated ambient air and the heated inert gas, to flow into the probe compartment to progressively thermally dry the quantum circuit; and controlling (FIG. 4, 406) a rate at which the inert gas flows into the temperature-controlled heating channel to cause the heated combination to have a relative humidity less than or equal to a relative humidity threshold (B2) In the method of B1, further comprising: automatically detecting that an amount of the inert gas in a reservoir from which the inert gas flows into the temperature-controlled heating channel is less than or equal to a threshold amount; automatically discontinuing heating of the inert gas by the in-line heater element based at least in part on detection that the amount of the inert gas in the reservoir is less than or equal to the threshold amount; and automatically generating a notification to indicate that the amount of the inert gas in the reservoir is less than or equal to the threshold amount.

(B3) In the method of any of B1-B2, further comprising: controlling a rate at which the heated ambient air flows into the temperature-controlled heating channel to cause the heated combination to have the relative humidity less than or equal to the relative humidity threshold.

(B4) In the method of any of B1-B3, further comprising: automatically generating a notification, which indicates that the quantum circuit is being thermally dried, based at least in part on the inert gas being progressively heated by the in-line heater element.

(B5) In the method of any of B1-B4, further comprising: automatically generating a notification, which indicates that thermal drying of the quantum circuit is complete, based at least in part on passage of a specified amount of time that begins at a time instance at which the inert gas begins to flow into the temperature-controlled heating channel.

(B6) In the method of any of B1-B5, wherein automatically generating the notification comprises: automatically initiating an alarm, which indicates that the thermal drying of the quantum circuit is complete, based at least in part on the passage of the specified amount of time that begins at the time instance at which the inert gas begins to flow into the temperature-controlled heating channel, the alarm including at least one of an audible alarm or a visual alarm; and wherein the method further comprises: automatically discontinuing the alarm based at least in part on passage of a designated amount of time that begins at a time instance at which the alarm is initiated.

(C1) An example method of progressively thermally drying a quantum circuit quantum circuit (FIG. 1, 148), the method comprising: identifying (FIG. 6, 604) initiation of a thermal drying process based on detection of an inert gas (FIG. 1, 140) flowing toward a probe compartment (FIG. 1, 128; FIG. 3, 328) that includes the quantum circuit; automatically initiating (FIG. 6, 608) heating of the inert gas by an in-line heater element (FIG. 1, 124; FIG. 2, 224; FIG. 3, 324) as the inert gas flows into the temperature-controlled heating channel to provide a heated inert gas (FIG. 1, 142) based on the initiation of the thermal drying process; causing (FIG. 6, 610) heated ambient air (FIG. 1, 146) and the heated inert gas to be combined in the temperature-controlled heating channel, which causes a heated combination (FIG. 1, 148), including the heated ambient air and the heated inert gas, to flow into the probe compartment to progressively thermally dry the quantum circuit; controlling (FIG. 6, 612) a rate at which the inert gas flows into the temperature-controlled heating channel to cause the heated combination to have a relative humidity less than or equal to a relative humidity threshold; and automatically discontinuing (FIG. 6, 614) flow of the inert gas into the temperature-controlled heating channel and the heating of the inert gas based on a discontinuation of the thermal drying process.

(C2) In the method of C1, further comprising: automatically progressively increasing an intensity of thermal energy that is applied to the inert gas by the in-line heater element over time to increase a temperature of the heated inert gas, the automatically progressively increasing the intensity of the thermal energy including automatically controlling a temperature of the in-line heater element to be approximately equal to a reference temperature, which progressively increases during the thermal drying process, within a tolerance of 2.5° C.

(C3) In the method of any of C1-C2, further comprising: automatically detecting that an amount of the inert gas in a reservoir from which the inert gas flows into the temperature-controlled heating channel is less than or equal to a threshold amount; automatically discontinuing heating of the inert gas by the in-line heater element based at least in part on detection that the amount of the inert gas in the reservoir is less than or equal to the threshold amount; and automatically generating a notification to indicate that the amount of the inert gas in the reservoir is less than or equal to the threshold amount.

(C4) In the method of any of C1-C3, further comprising: automatically controlling a rate at which the heated ambient air flows into the temperature-controlled heating channel to cause the heated combination to have the relative humidity less than or equal to the relative humidity threshold.

(C5) In the method of any of C1-C4, further comprising: automatically generating a notification, which indicates that the thermal drying process is in progress, based at least in part on identifying the initiation of the thermal drying process.

(C6) In the method of any of C1-05, further comprising: automatically generating a notification, which indicates that the thermal drying process is discontinued, based at least in part on the discontinuation of the thermal drying process.

(C7) In the method of any of C1-C6, wherein automatically generating the notification comprises: automatically initiating an alarm, which indicates that the thermal drying process is discontinued, based at least in part on the discontinuation of the thermal drying process, the alarm including at least one of an audible alarm or a visual alarm; and wherein the method further comprises: automatically discontinuing the alarm based at least in part on passage of a designated amount of time that begins at a time instance at which the alarm is initiated.

(C8) In the method of any of C1-C7, further comprising: monitoring a temperature of the in-line heater element during the thermal drying process; and automatically triggering the discontinuation of the thermal drying process based at least in part on the temperature reaching a temperature threshold.

(C9) In the method of any of C1-C8, further comprising: causing a setup interface to be presented to a user via a network, the setup interface enabling the user to set at least one of the following: a temperature to which the in-line heater element is to be heated; a maximum temperature, which corresponds to the in-line heater element, at which the temperature controller is configured to automatically cause the in-line heater element to discontinue heating of the inert gas; the relative humidity threshold; a duration of the thermal drying process.

(C10) In the method of any of C1-C9, further comprising: causing a monitoring interface to be presented to a user via a network, the monitoring interface enabling the user to monitor at least one of the following: an amount of the inert gas in a reservoir from which the inert gas flows into the temperature-controlled heating; a setpoint temperature of the in-line heater element; a progressive temperature of the in-line heater element; the relative humidity of the heated combination; an amount of time since initiation of the thermal drying process.

(D1) An example computer program product (FIG. 7, 718, 722) comprising a computer-readable storage medium having instructions recorded thereon for enabling a processor-based system (FIG. 7, 700) to progressively thermally dry a quantum circuit (FIG. 1, 148) by performing operations, the operations comprising: cause (FIG. 4, 402) an in-line heater element (FIG. 1, 124; FIG. 2, 224; FIG. 3, 324) to progressively heat an inert gas (FIG. 1, 140) as the inert gas flows into a temperature-controlled heating channel (FIG. 1, 126; FIG. 3, 326) toward a probe compartment (FIG. 1, 128; FIG. 3, 328) that includes the quantum circuit to provide a heated inert gas (FIG. 1, 142) by controlling a temperature of the in-line heater element to be approximately equal to a target temperature, which progressively increases over time, within a tolerance of 3.0° C.; cause (FIG. 4, 404) heated ambient air (FIG. 1, 146) and the heated inert gas to be combined in the temperature-controlled heating channel, which causes a heated combination (FIG. 1, 148), including the heated ambient air and the heated inert gas, to flow into the probe compartment to progressively thermally dry the quantum circuit; and control (FIG. 4, 406) a rate at which the inert gas flows into the temperature-controlled heating channel to cause the heated combination to have a relative humidity less than or equal to a relative humidity threshold.

(E1) An example computer program product (FIG. 7, 718, 722) comprising a computer-readable storage medium having instructions recorded thereon for enabling a processor-based system (FIG. 7, 700) to progressively thermally dry a quantum circuit (FIG. 1, 148) by performing operations, the operations comprising: identify (FIG. 6, 604) initiation of a thermal drying process based on detection of an inert gas (FIG. 1, 140) flowing toward a probe compartment (FIG. 1, 128; FIG. 3, 328) that includes the quantum circuit; automatically cause (FIG. 6, 608) an in-line heater element (FIG. 1, 124; FIG. 2, 224; FIG. 3, 324) to initiate heating of the inert gas as the inert gas flows into the temperature-controlled heating channel to provide a heated inert gas (FIG. 1, 142) based on the initiation of the thermal drying process; cause (FIG. 6, 610) heated ambient air (FIG. 1, 146) and the heated inert gas to be combined in the temperature-controlled heating channel, which causes a heated combination (FIG. 1, 148), including the heated ambient air and the heated inert gas, to flow into the probe compartment to progressively thermally dry the quantum circuit; control (FIG. 6, 612) a rate at which the inert gas flows into the temperature-controlled heating channel to cause the heated combination to have a relative humidity less than or equal to a relative humidity threshold; and automatically discontinue (FIG. 6, 614) flow of the inert gas into the temperature-controlled heating channel and the heating of the inert gas based on a discontinuation of the thermal drying process.

(E2) In the computer program product of E1, wherein the operations further comprise: automatically cause the in-line heater element to progressively increase an intensity of thermal energy that is applied to the inert gas over time to increase a temperature of the heated inert gas by automatically controlling a temperature of the in-line heater element to be approximately equal to a reference temperature, which progressively increases during the thermal drying process, within a tolerance of 2.5° C.

(E3) In the computer program product of any of E1-E2, wherein the operations further comprise: automatically detect that an amount of the inert gas in a reservoir from which the inert gas flows into the temperature-controlled heating channel is less than or equal to a threshold amount; automatically cause the in-line heater element to discontinue heating of the inert gas based at least in part on detection that the amount of the inert gas in the reservoir is less than or equal to the threshold amount; and automatically generate a notification to indicate that the amount of the inert gas in the reservoir is less than or equal to the threshold amount.

(E4) In the computer program product of any of E1-E3, wherein the operations further comprise: monitor a temperature of the in-line heating element during the thermal drying process; and automatically trigger the discontinuation of the thermal drying process based at least in part on the temperature reaching a temperature threshold.

IV. Example Computer System

Figure 7:
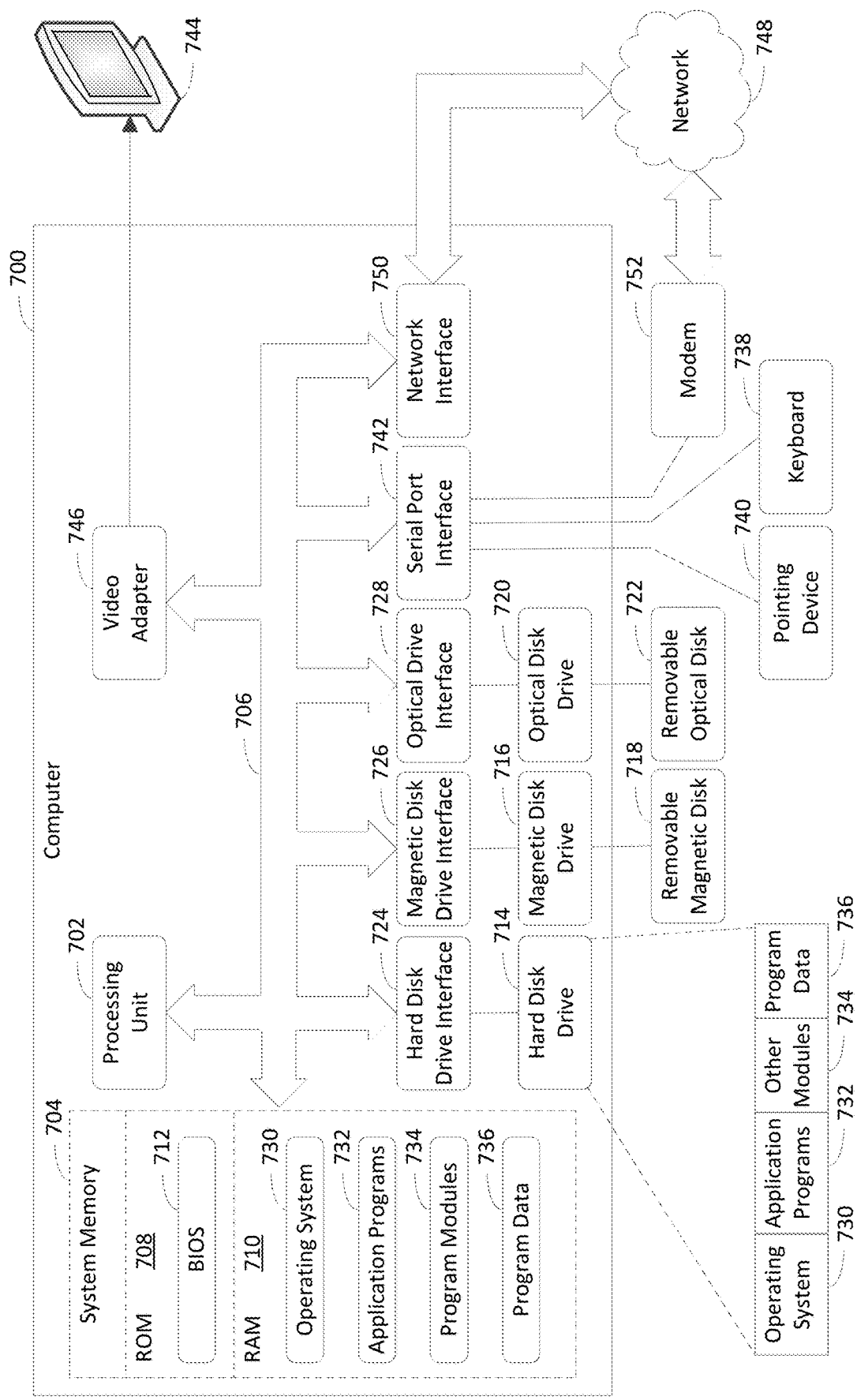
FIG. 7 depicts an example computer in which embodiments may be implemented.

FIG. 7 depicts an example computer 700 in which embodiments may be implemented. Any one or more of the components in the progressive thermal drying chamber 100 shown in FIG. 1; any one or more of the components in the progressive thermal drying chamber 200 shown in FIG. 2; and/or any one or more of the components in the progressive thermal drying chamber 300 shown in FIG. 3 may be implemented using computer 700, including one or more features of computer 700 and/or alternative features. Computer 700 may be a general-purpose computing device in the form of a conventional personal computer, a mobile computer, or a workstation, for example, or computer 700 may be a special purpose computing device. The description of computer 700 provided herein is provided for purposes of illustration, and is not intended to be limiting. Embodiments may be implemented in further types of computer systems, as would be known to persons skilled in the relevant art(s).

As shown in FIG. 7, computer 700 includes a processing unit 702, a system memory 704, and a bus 706 that couples various system components including system memory 704 to processing unit 702. Bus 706 represents one or more of any of several types of bus structures, including a memory bus or memory controller, a peripheral bus, an accelerated graphics port, and a processor or local bus using any of a variety of bus architectures. System memory 704 includes read only memory (ROM) 708 and random access memory (RAM) 710. A basic input/output system 712 (BIOS) is stored in ROM 708.

Computer 700 also has one or more of the following drives: a hard disk drive 714 for reading from and writing to a hard disk, a magnetic disk drive 716 for reading from or writing to a removable magnetic disk 718, and an optical disk drive 720 for reading from or writing to a removable optical disk 722 such as a CD ROM, DVD ROM, or other optical media. Hard disk drive 714, magnetic disk drive 716, and optical disk drive 720 are connected to bus 706 by a hard disk drive interface 724, a magnetic disk drive interface 726, and an optical drive interface 728, respectively. The drives and their associated computer-readable storage media provide nonvolatile storage of computer-readable instructions, data structures, program modules and other data for the computer. Although a hard disk, a removable magnetic disk and a removable optical disk are described, other types of computer-readable storage media can be used to store data, such as flash memory cards, digital video disks, random access memories (RAMs), read only memories (ROM), and the like.

A number of program modules may be stored on the hard disk, magnetic disk, optical disk, ROM, or RAM. These programs include an operating system 730, one or more application programs 732, other program modules 734, and program data 736. Application programs 732 or program modules 734 may include, for example, computer program logic for implementing any one or more of (e.g., at least a portion of) the components in the progressive thermal drying chamber 100, any one or more of the components in the progressive thermal drying chamber 200, any one or more of the components in the progressive thermal drying chamber 300, flowchart 400 (including any step of flowchart 400), flowchart 500 (including any step of flowchart 500), and/or flowchart 600 (including any step of flowchart 600), as described herein.

A user may enter commands and information into the computer 700 through input devices such as keyboard 738 and pointing device 740. Other input devices (not shown) may include a microphone, joystick, game pad, satellite dish, scanner, touch screen, camera, accelerometer, gyroscope, or the like. These and other input devices are often connected to the processing unit 702 through a serial port interface 742 that is coupled to bus 706, but may be connected by other interfaces, such as a parallel port, game port, or a universal serial bus (USB).

A display device 744 (e.g., a monitor) is also connected to bus 706 via an interface, such as a video adapter 746. In addition to display device 744, computer 700 may include other peripheral output devices (not shown) such as speakers and printers.

Computer 700 is connected to a network 748 (e.g., the Internet) through a network interface or adapter 750, a modem 752, or other means for establishing communications over the network. Modem 752, which may be internal or external, is connected to bus 706 via serial port interface 742.

As used herein, the terms "computer program medium" and "computer-readable storage medium" are used to generally refer to media (e.g., non-transitory media) such as the hard disk associated with hard disk drive 714, removable magnetic disk 718, removable optical disk 722, as well as other media such as flash memory cards, digital video disks, random access memories (RAMs), read only memories (ROM), and the like. A computer-readable storage medium is not a signal, such as a carrier signal or a propagating signal. For instance, a computer-readable storage medium may not include a signal. Accordingly, a computer-readable storage medium does not constitute a signal per se. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Example embodiments are also directed to such communication media.

As noted above, computer programs and modules (including application programs 732 and other program modules 734) may be stored on the hard disk, magnetic disk, optical disk, ROM, or RAM. Such computer programs may also be received via network interface 750 or serial port interface 742. Such computer programs, when executed or loaded by an application, enable computer 700 to implement features of embodiments discussed herein. Accordingly, such computer programs represent controllers of the computer 700.

Example embodiments are also directed to computer program products comprising software (e.g., computer-readable instructions) stored on any computer-useable medium. Such software, when executed in one or more data processing devices, causes data processing device(s) to operate as described herein. Embodiments may employ any computer-useable or computer-readable medium, known now or in the future. Examples of computer-readable mediums include, but are not limited to storage devices such as RAM, hard drives, floppy disks, CD ROMs, DVD ROMs, zip disks, tapes, magnetic storage devices, optical storage devices, MEMS-based storage devices, nanotechnology-based storage devices, and the like.

It will be recognized that the disclosed technologies are not limited to any particular computer or type of hardware. Certain details of suitable computers and hardware are well known and need not be set forth in detail in this disclosure.

V. Conclusion

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. A progressive thermal drying chamber comprising:
a probe compartment configured to house a quantum circuit during a thermal drying process;
a temperature-controlled heating channel coupled to the probe compartment and configured to provide a heated combination, which includes heated ambient air and a heated inert gas, to the probe compartment;
an in-line heater element configured to heat an inert gas to provide the heated inert gas;
a temperature controller configured to control a temperature of the in-line heater element such that the in-line heater element progressively heats the inert gas as the inert gas flows into the temperature-controlled heating channel;
a flow rate controller configured to control a rate at which the inert gas flows into the temperature-controlled heating channel to cause the heated combination to have a relative humidity less than or equal to a relative humidity threshold; and
electronic control circuitry configured to control the in-line heater element and the temperature controller, wherein the electronic control circuitry is external to the temperature-controlled heating channel.

2. The progressive thermal drying chamber of claim 1, wherein the temperature controller is configured to control the temperature of the in-line heater element to track a progressively increasing target temperature within a tolerance of 3.0° C.

3. The progressive thermal drying chamber of claim 1, wherein the temperature controller is configured to identify initiation of the thermal drying process based on detection of the inert gas flowing toward the probe compartment;
wherein the temperature controller is configured to automatically cause the in-line heater element to initiate heating of the inert gas based on the initiation of the thermal drying process;
wherein the temperature controller is configured to automatically cause the in-line heater element to discontinue heating of the inert gas based on a discontinuation of the thermal drying process; and
wherein the flow rate controller is configured to automatically discontinue flow of the inert gas into the temperature-controlled heating channel based on the discontinuation of the thermal drying process.

4. The progressive thermal drying chamber of claim 1, wherein the temperature controller is configured to automatically cause the in-line heater element to discontinue heating of the inert gas based on a discontinuation of a supply of the inert gas.

5. The progressive thermal drying chamber of claim 1, wherein the probe compartment is capable of housing probes of different sizes, the size of each probe corresponding a size of a quantum circuit that the probe is configured to support.

6. A method of progressively thermally drying a quantum circuit, the method comprising:
progressively heating an inert gas by an in-line heater element as the inert gas flows into a temperature-controlled heating channel toward a probe compartment that includes the quantum circuit to provide a heated inert gas, the progressively heating including controlling a temperature of the in-line heater element to be approximately equal to a target temperature, which progressively increases over time, within a tolerance of 3.0° C.;
causing heated ambient air and the heated inert gas to be combined in the temperature-controlled heating channel, which causes a heated combination, including the heated ambient air and the heated inert gas, to flow into the probe compartment to progressively thermally dry the quantum circuit; and
controlling a rate at which the inert gas flows into the temperature-controlled heating channel to cause the heated combination to have a relative humidity less than or equal to a relative humidity threshold.

7. The method of claim 6, further comprising:
automatically detecting that an amount of the inert gas in a reservoir from which the inert gas flows into the temperature-controlled heating channel is less than or equal to a threshold amount;
automatically discontinuing heating of the inert gas by the in-line heater element based at least in part on detection that the amount of the inert gas in the reservoir is less than or equal to the threshold amount; and
automatically generating a notification to indicate that the amount of the inert gas in the reservoir is less than or equal to the threshold amount.

8. The method of claim 6, further comprising:
controlling a rate at which the heated ambient air flows into the temperature-controlled heating channel to cause the heated combination to have the relative humidity less than or equal to the relative humidity threshold.

9. The method of claim 6, further comprising:
automatically generating a notification, which indicates that the quantum circuit is being thermally dried, based at least in part on the inert gas being progressively heated by the in-line heater element.

10. The method of claim 6, further comprising:
automatically generating a notification, which indicates that thermal drying of the quantum circuit is complete, based at least in part on passage of a specified amount of time that begins at a time instance at which the inert gas begins to flow into the temperature-controlled heating channel.

11. The method of claim 10, wherein automatically generating the notification comprises:
automatically initiating an alarm, which indicates that the thermal drying of the quantum circuit is complete, based at least in part on the passage of the specified amount of time that begins at the time instance at which the inert gas begins to flow into the temperature-controlled heating channel, the alarm including at least one of an audible alarm or a visual alarm; and
wherein the method further comprises:
automatically discontinuing the alarm based at least in part on passage of a designated amount of time that begins at a time instance at which the alarm is initiated.

12. A method of progressively thermally drying a quantum circuit, the method comprising:
identifying initiation of a thermal drying process based on detection of an inert gas flowing toward a probe compartment that includes the quantum circuit;
automatically initiating heating of the inert gas by an in-line heater element as the inert gas flows into the temperature-controlled heating channel to provide a heated inert gas based on the initiation of the thermal drying process;

causing heated ambient air and the heated inert gas to be combined in the temperature-controlled heating channel, which causes a heated combination, including the heated ambient air and the heated inert gas, to flow into the probe compartment to progressively thermally dry the quantum circuit;

controlling a rate at which the inert gas flows into the temperature-controlled heating channel to cause the heated combination to have a relative humidity less than or equal to a relative humidity threshold; and automatically discontinuing flow of the inert gas into the temperature-controlled heating channel and the heating of the inert gas based on a discontinuation of the thermal drying process.

13. The method of claim 12, further comprising:

automatically progressively increasing an intensity of thermal energy that is applied to the inert gas by the in-line heater element over time to increase a temperature of the heated inert gas, the automatically progressively increasing the intensity of the thermal energy including automatically controlling a temperature of the in-line heater element to be approximately equal to a reference temperature, which progressively increases during the thermal drying process, within a tolerance of 2.5° C.

14. The method of claim 12, further comprising:

automatically detecting that an amount of the inert gas in a reservoir from which the inert gas flows into the temperature-controlled heating channel is less than or equal to a threshold amount;

automatically discontinuing heating of the inert gas by the in-line heater element based at least in part on detection that the amount of the inert gas in the reservoir is less than or equal to the threshold amount; and automatically generating a notification to indicate that the amount of the inert gas in the reservoir is less than or equal to the threshold amount.

15. The method of claim 12, further comprising:

automatically controlling a rate at which the heated ambient air flows into the temperature-controlled heating channel to cause the heated combination to have the relative humidity less than or equal to the relative humidity threshold.

16. The method of claim 12, further comprising:

automatically generating a notification, which indicates that the thermal drying process is in progress, based at least in part on identifying the initiation of the thermal drying process.

17. The method of claim 12, further comprising:

automatically generating a notification, which indicates that the thermal drying process is discontinued, based at least in part on the discontinuation of the thermal drying process.

18. The method of claim 17, wherein automatically generating the notification comprises:

automatically initiating an alarm, which indicates that the thermal drying process is discontinued, based at least in part on the discontinuation of the thermal drying process, the alarm including at least one of an audible alarm or a visual alarm; and wherein the method further comprises:

automatically discontinuing the alarm based at least in part on passage of a designated amount of time that begins at a time instance at which the alarm is initiated.

19. The method of claim 12, further comprising:

causing a setup interface to be presented to a user via a network, the setup interface enabling the user to set at least one of the following:

a temperature to which the in-line heater element is to be heated;

a maximum temperature, which corresponds to the in-line heater element, at which the temperature controller is configured to automatically cause the in-line heater element to discontinue heating of the inert gas;

the relative humidity threshold;

a duration of the thermal drying process.

20. The method of claim 12, further comprising:

causing a monitoring interface to be presented to a user via a network, the monitoring interface enabling the user to monitor at least one of the following:

an amount of the inert gas in a reservoir from which the inert gas flows into the temperature-controlled heating;

a setpoint temperature of the in-line heater element;

a progressive temperature of the in-line heater element;

the relative humidity of the heated combination;

an amount of time since initiation of the thermal drying process.

* * * * *